United States Patent
Kim et al.

(10) Patent No.: US 11,631,718 B2
(45) Date of Patent: Apr. 18, 2023

(54) VERTICAL NONVOLATILE MEMORY DEVICE INCLUDING MEMORY CELL STRING

(71) Applicant: Samsung Electronics Co., Ltd., Suwon-si (KR)

(72) Inventors: Jinhong Kim, Seoul (KR); Seyun Kim, Seoul (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/345,423

(22) Filed: Jun. 11, 2021

(65) Prior Publication Data
US 2022/0020818 A1    Jan. 20, 2022

(30) Foreign Application Priority Data
Jul. 20, 2020 (KR) ................ 10-2020-0089858

(51) Int. Cl.
*G11C 11/00* (2006.01)
*H01L 27/24* (2006.01)
(Continued)

(52) U.S. Cl.
CPC ...... *H01L 27/2481* (2013.01); *G11C 11/5685* (2013.01); *G11C 13/0007* (2013.01);
(Continued)

(58) Field of Classification Search
CPC ............ H01L 27/2481; H01L 27/2454; H01L 45/1233; H01L 45/146; H01L 45/147;
(Continued)

(56) References Cited

U.S. PATENT DOCUMENTS 8,427,865 B2 * 4/2013 Shima ................ H01L 45/1683
                                                                365/163
8,507,995 B2 * 8/2013 Masuoka ............ H01L 27/0207
                                                                257/E27.098
(Continued)

FOREIGN PATENT DOCUMENTS

JP        2013-135065 A     7/2013
KR   10-2010-0091900 A     8/2010

OTHER PUBLICATIONS

Jinho Oh et al., "Physical and electrical properties of band-engineered SiO2/(TiO2)x(SiO2)1.x.stacks for nonvolatile memory applications", Applied Physics A, May 11, 2012, p. 679-684.
(Continued)

*Primary Examiner* — Viet Q Nguyen
(74) *Attorney, Agent, or Firm* — Harness, Dickey & Pierce, P.L.C.

(57) ABSTRACT

A vertical nonvolatile memory device including memory cell strings using a resistance change material is provided. Each of the memory cell strings of the nonvolatile memory device includes a semiconductor layer extending in a first direction; a plurality of gates and a plurality of insulators alternately arranged in the first direction; a gate insulating layer extending in the first direction between the plurality of gates and the semiconductor layer and between the plurality of insulators and the semiconductor layer; and a resistance change layer extending in the first direction on a surface of the semiconductor layer. The resistance change layer includes a metal-semiconductor oxide including a mixture of a semiconductor material of the semiconductor layer and a transition metal oxide.

32 Claims, 35 Drawing Sheets

(51) Int. Cl.
*G11C 11/56* (2006.01)
*G11C 13/00* (2006.01)
*H01L 45/00* (2006.01)

(52) U.S. Cl.
CPC ...... *G11C 13/0026* (2013.01); *G11C 13/0069* (2013.01); *H01L 27/2454* (2013.01); *H01L 45/1233* (2013.01); *H01L 45/146* (2013.01); *H01L 45/147* (2013.01)

(58) Field of Classification Search
CPC ............ G11C 11/5685; G11C 13/0007; G11C 13/0069
USPC .......................................................... 365/148
See application file for complete search history.

(56) References Cited

U.S. PATENT DOCUMENTS

| | | | |
|---|---|---|---|
| 8,895,948 B2 | 11/2014 | Arayashiki | |
| 9,385,320 B2* | 7/2016 | Sasago | H01L 45/04 |
| 9,899,401 B2 | 2/2018 | Seol et al. | |
| 10,896,728 B2* | 1/2021 | Kanamori | G11C 7/12 |
| 11,056,645 B2* | 7/2021 | Lee | H01L 45/124 |
| 11,127,897 B2* | 9/2021 | Lee | G11C 11/5685 |
| 11,165,018 B2* | 11/2021 | Lee | H01L 45/1233 |
| 2006/0223337 A1 | 10/2006 | Ahn et al. | |
| 2012/0074368 A1* | 3/2012 | Sasago | H01L 27/2409 438/587 |
| 2013/0328005 A1 | 12/2013 | Shin et al. | |
| 2014/0103283 A1 | 4/2014 | Park et al. | |
| 2017/0373086 A1 | 12/2017 | Pang et al. | |
| 2019/0287611 A1 | 9/2019 | Tseng et al. | |
| 2019/0362786 A1 | 11/2019 | Sugimae et al. | |
| 2020/0058859 A1 | 2/2020 | Wang et al. | |
| 2020/0161328 A1* | 5/2020 | Yoon | H01L 27/2454 |
| 2021/0035635 A1* | 2/2021 | Yoon | H01L 45/147 |
| 2021/0210551 A1* | 7/2021 | Han | H01L 45/147 |
| 2021/0217473 A1 | 7/2021 | Cho et al. | |
| 2021/0296255 A1* | 9/2021 | Konomi | H01L 23/544 |
| 2021/0305230 A1* | 9/2021 | Okajima | H01L 24/08 |

OTHER PUBLICATIONS

Extended European Search Report dated Nov. 4, 2021, issued in corresponding European Patent Application No. 21180142.8.

* cited by examiner

FIG. 17

| Oxide | Icc (A) | Yield (%) (On/Off >1000) | Non-uniformity |
|---|---|---|---|
| $HfO_2$ | no Icc | 90.16 | 25.2 |
| $TiO_2$ | 100 nA | 93.88 | 8.7 |
| $Al_2O_3$ | 1 uA | 14.06 | 29.2 |

FIG. 23

| Thickness (nm) | Icc | Yield (%) (On/Off>10) | Vset median (On/Off>10) | Non-uniformity (On/Off>10) |
| --- | --- | --- | --- | --- |
| 0.3 | 100 nA | 51.6 | 6.1 | 43.2 |
| 0.4 | 100 nA | 95.8 | 6.2 | 11.3 |
| 0.5 | 100 nA | 96.8 | 6.1 | 10.8 |
| 0.6 | 100 nA | 92.2 | 6.1 | 12.0 |
| 0.7 | 100 nA | 82.8 | 5.9 | 8.5 |
| 0.8 | 100 nA | 85.9 | 5.5 | 25.8 |
| 1 | 100 nA | 18.8 | 5.9 | 6.8 |
| 1.5 | 100 nA | 0 | - | - |

VERTICAL NONVOLATILE MEMORY DEVICE INCLUDING MEMORY CELL STRING

CROSS-REFERENCE TO RELATED APPLICATION

This application is based on and claims priority under 35 U.S.C. § 119 to Korean Patent Application No. 10-2020-0089858, filed on Jul. 20, 2020, in the Korean Intellectual Property Office, the disclosure of which is incorporated by reference herein in its entirety.

BACKGROUND

1. Field

The disclosure relates to a vertical nonvolatile memory device including memory cell strings.

2. Description of Related Art

A nonvolatile memory device, which is a semiconductor memory device, includes a plurality of memory cells that retain data even in a state in which power supply thereto is blocked, and may use the stored data again when the power is supplied. Nonvolatile memory devices may be used in a cellular phone, a digital camera, a portable digital assistant (PDA), a mobile computer device, a stationary computer device, and other devices.

Recently, research into using a three-dimensional (or a vertical) NAND (or VNAND) structure in a chip for forming a next-generation neuromorphic computing platform or a neural network has been conducted. In detail, technologies for obtaining high density and low power consumption and capable of allowing a random access to a memory cell may be required.

SUMMARY

Additional aspects will be set forth in part in the description which follows and, in part, will be apparent from the description, or may be learned by practice of the presented embodiments of the disclosure.

According to an embodiment, a nonvolatile memory device includes a plurality of memory cell strings, each of the plurality of memory cell strings including a semiconductor layer, a plurality of gates and a plurality of insulators, a gate insulating layer, and a resistance change layer. The semiconductor layer includes a first semiconductor material and extends in a first direction. The semiconductor layer includes a first surface and a second surface opposite the first surface. The plurality of gates and the plurality of insulators each extend in a second direction perpendicular to the first direction, and the plurality of gates and the plurality of insulators are alternately arranged in the first direction. The gate insulating layer extends in the first direction between the plurality of gates and the first surface of the semiconductor layer and between the plurality of insulators and the first surface of the semiconductor layer. The resistance change layer extends in the first direction on the second surface of the semiconductor layer. The resistance change layer includes a metal-semiconductor oxide including a second semiconductor material and a transition metal oxide, and the metal-semiconductor oxide has a charge trap site in a band gap of an oxide of the second semiconductor material.

In some embodiments, the metal-semiconductor oxide in the resistance change layer may have an anti-site defect due to inversion of a site between the second semiconductor material and the transition metal oxide.

In some embodiments, a band gap of the transition metal oxide may be less than the band gap of the oxide of the second semiconductor material.

For example, in some embodiments, the band gap of the transition metal oxide may be less than about 4.5 eV.

For example, in some embodiments, the band gap of the transition metal oxide may be less than about 3.5 eV.

In some embodiments, the first semiconductor material and the second semiconductor material may be the same.

In some embodiments, the first semiconductor material and the second semiconductor material may be different from each other, and the metal-semiconductor oxide of the resistance change layer may include both of the first semiconductor material and the second semiconductor material.

In some embodiments, the transition metal oxide may include at least one selected from among $Ta_2O_5$, $BaO$, and $TiO_2$, and the metal-semiconductor oxide may include at least one of a Ta-silicate, a Ba-silicate, a Ti-silicate, $TaGe_xO_y$, $BaGe_xO_y$, and $TiGe_xO_y$.

In some embodiments, the first semiconductor material of the semiconductor layer may include at least one selected from among Si, Ge, indium gallium zinc oxide (IGZO), and GaAs.

In some embodiments, a ratio of the second semiconductor material to the resistance change layer may be about 20 at. % to about 80 at. %.

Also, in some embodiments, the ratio of the second semiconductor material to the resistance change layer may be about 40 at. % to about 60 at. %.

In some embodiments, the ratio of the second semiconductor material to the resistance change layer may be approximately constant throughout an entire area of the resistance change layer within a deviation range of about 10%.

In some embodiments, a thickness of the resistance change layer in the second direction may be about 0.1 nm to about 2.0 nm.

Also, in some embodiments, the thickness of the resistance change layer in the second direction may be about 0.3 nm to about 1.5 nm.

Also, in some embodiments, the thickness of the resistance change layer in the second direction may be about 0.5 nm to about 1.0 nm.

In some embodiments, the thickness of the resistance change layer may approximately constant throughout an entire area of the resistance change layer extending in the first direction within a deviation range of about 10%.

In some embodiments, one memory cell may be defined by one gate among the plurality of gates, a portion of the gate insulating layer adjacent to the gate in the second direction, a portion of the semiconductor layer adjacent to the gate in the second direction, and a portion of the resistance change layer adjacent to the gate in the second direction. A plurality of memory cells may be arranged in each of the memory cell strings as a vertical stack structure.

In some embodiments, the nonvolatile memory device may further include: a control logic configured to apply, in a program mode, a turn-on voltage to the gate of a non-select memory cell from among the plurality of memory cell strings and a turn-off voltage to the gate of a select memory cell from among the plurality of memory cell strings; and a bit line configured to apply a program voltage to the select memory cell.

In some embodiments, the resistance change layer may be formed such that, in response to a positive program voltage being applied to the select memory cell through the bit line, a resistance of one or more areas of the resistance change layer corresponding to the select memory cell decreases because an electron is trapped in a charge trap in the one or more areas of the resistance change layer, and in response to a negative program voltage being applied to the select memory cell through the bit line, the resistance of the one or more areas of the resistance change layer corresponding to the select memory cell increases because the electron is de-trapped from the charge trap in the one or more areas of the resistance change layer.

In some embodiments, the positive program voltage may be 10V or less.

Also, In some embodiments, the positive program voltage may be in a range between about 5V and about 8V.

In some embodiments, in response to the resistance of the one or more areas of the resistance change layer decreases, a direction of a current flowing through the one or more areas of the resistance change layer may be the same as the first direction in which the resistance change layer extends.

In some embodiments, one or more areas of the resistance change layer may have at least three different resistance states.

In some embodiments, resistance states of the one or more areas of the resistance change layer may be selected by adjusting a current applied to the one or more areas of the resistance change layer.

In some embodiments, the resistance change layer may be formed such that, in response to a positive program voltage being applied to the select memory cell through the bit line, oxygen vacancies move toward an interface between the semiconductor layer and the resistance change layer, in one or more areas of the resistance change layer corresponding to the select memory cell, and in response to a negative program voltage being applied to the select memory cell through the bit line, the oxygen vacancies move away from the interface between the semiconductor layer and the resistance change layer, in the one or more areas of the resistance change layer corresponding to the select memory cell.

In some embodiments, the resistance change layer may be formed such that, in response to the oxygen vacancies moving toward the interface between the semiconductor layer and the resistance change layer in the one or more areas of the resistance change layer so as to increase a density of the oxygen vacancies at the interface between the semiconductor layer and the resistance change layer, a resistance of the one or more areas of the resistance change layer is decreased, and in response to the oxygen vacancies moving away from the interface between the semiconductor layer and the resistance change layer in the one or more areas of the resistance change layer so as to decrease the density of the oxygen vacancies at the interface between the semiconductor layer and the resistance change layer, the resistance of the one or more areas of the resistance change layer is increased.

In some embodiments, a resistance state of the resistance change layer may be configured to change depending on a phenomenon in which an electron is trapped in a charge trap defined by the oxygen vacancies or de-trapped from the charge trap defined by the oxygen vacancies.

According to an embodiment, a nonvolatile memory device includes a substrate; a plurality of bit lines over the substrate, the plurality of bit lines extending in a first direction and being spaced apart from each other in a second direction crossing the first direction; a plurality of gates and a plurality of insulators alternatively stacked on the substrate in a third direction vertical to a top surface of the substrate; and a plurality of pillars spaced apart from each other on the substrate. Each corresponding pillar among the plurality of pillars is electrically connected to a corresponding bit line among the plurality of bit lines. Each of the plurality of pillars extend in the third direction through a corresponding hole defined in the plurality of gate and the plurality of insulators alternately stacked. Each of the plurality of pillars include a resistance change layer extending in the third direction, a semiconductor layer surrounding the resistance change layer, and a gate insulating layer surrounding the semiconductor layer. The resistance change layer includes a metal-semiconductor oxide having a resistance varying according to a voltage applied thereto, and the resistance change layer includes a charge trap site.

In some embodiments, in at least one of the plurality of the pillars, the gate insulating layer may directly contact a first surface of the semiconductor layer, the resistance change layer may directly contact a second surface of the semiconductor layer that is opposite the first surface of the semiconductor layer, and the gate insulating layer may extend between the plurality of gates and the semiconductor layer.

In some embodiments, a thickness of the resistance change layer may be about 0.3 nm to about 1.5 nm.

In some embodiments, the metal-semiconductor oxide of the resistance change layer may include a semiconductor material and a transition metal oxide. The transition metal oxide may include at least one selected among $Ta_2O_5$, $BaO$, and $TiO_2$. The semiconductor material may include at least one selected among Si, Ge, indium gallium zinc oxide (IGZO), and GaAs.

In some embodiments, a ratio of the semiconductor material to the transition metal oxide in the resistance change layer may be about 20 at. % to about 80 at. %.

BRIEF DESCRIPTION OF THE DRAWINGS

The above and other aspects, features, and effects of certain embodiments of the disclosure will be more apparent from the following description taken in conjunction with the accompanying drawings, in which:

FIG. 17 is a comparison table between the characteristics of a memory cell including a metal-semiconductor oxide according to an embodiment and a memory cell including a metal-semiconductor oxide according to a comparative embodiment;

FIG. 23 is a table showing changes of characteristics of the memory cell illustrated in FIG. 11 according to a gradual thickness change of a transition metal oxide;

DETAILED DESCRIPTION

Figure 1:
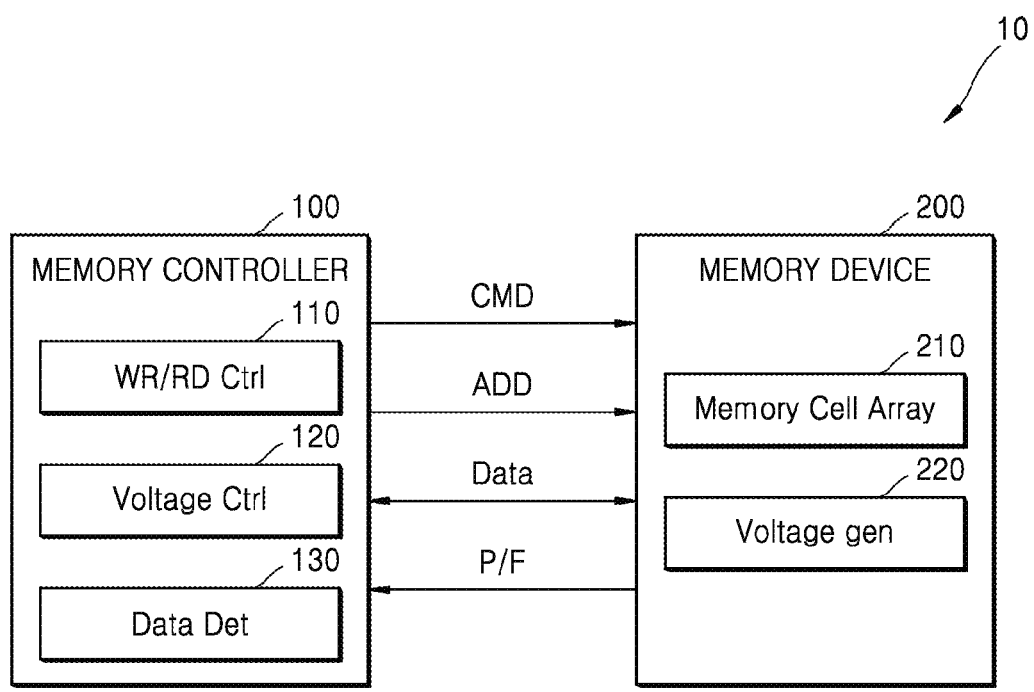
FIG. 1 is a block diagram of a memory system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a vertical nonvolatile memory device including a memory cell string will be described in detail with reference to the accompanying drawings. In the drawings, the same reference numerals denote the same elements and the sizes of elements may be exaggerated for clarity and convenience of explanation. The embodiments described hereinafter are only examples, and various modifications may be made based on the embodiments.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. Unless orders of operations included in a method are specifically described or there are contrary descriptions, the operations may be performed according to appropriate orders.

Also, the terms such as " . . . unit," "module," or the like used in the specification indicate an unit, which processes at least one function or motion, and the unit may be implemented by hardware or software, or by a combination of hardware and software.

The connecting lines or connectors shown in the various figures presented are intended to represent example functional relationships and/or physical or logical couplings between the various elements. It should be noted that many alternative or additional functional relationships, physical connections or logical connections may be present in a practical device.

The use of all examples and example terms are merely for describing the disclosure in detail and the disclosure is not limited to the examples and the example terms, unless they are not defined in the scope of the claims.

FIG. 1 is a block diagram of a memory system 10 according to an embodiment.

Referring to FIG. 1, the memory system 10, according to an embodiment, may include a memory controller 100 and a memory device 200. The memory controller 100 may perform a controlling operation with respect to the memory device 200. For example, the memory controller 100 may provide an address ADD and a command CMD to the memory device 200 so as to perform operations of programming (or writing), reading, and erasing on the memory device 200. Also, data for the program operation and read data may be transmitted and received between the memory controller 100 and the memory device 200. The memory device 200 may provide the memory controller 100 a pass/fail signal P/F according to a read result with respect to the read data. The memory controller 100 may refer to the pass/fail signal P/F and thus control write and read operations of the memory cell array 210.

The memory device 200 may include a memory cell array 210 and a voltage generator 220. The memory cell array 210 may include a plurality of memory cells arranged in regions where a plurality of word lines and a plurality of bit lines intersect. The memory cell array 210 may include nonvolatile memory cells for storing data in a nonvolatile manner and may include flash memory cells, as the nonvolatile memory cells, such as a NAND flash memory cell array or a NOR flash memory cell array. Hereinafter, embodiments of the disclosure will be described where the memory cell array 210 includes the flash memory cell array 210, and thus, the memory device 200 is a nonvolatile memory device.

The memory controller 100 may include a write/read controller 110, a voltage controller 120, and a data determiner 130.

The write/read controller 110 may generate an address ADD and a command CMD for performing programming/reading and erasing operations on the memory cell array 210. Also, the voltage controller 120 may generate a voltage control signal for controlling at least one voltage level used in the nonvolatile memory device 200. For example, the voltage controller 120 may generate a voltage control signal for controlling a voltage level of a word line for reading data from the memory cell array 210 or programming data on the memory cell array 210.

The data determiner 130 may determine the data read from the memory device 200. For example, in order to determine the data read from the memory cells, the data determiner 130 may determine the number of on cells and/or off cells from among the memory cells. As an example of an operation, when program operations are performed on the plurality of memory cells, a state of the data of the memory cells may be determined by using a desired and/or alternatively predetermined read voltage, in order to determine whether or not the program operations are normally completed on all of the cells.

The memory device 200 may include the memory cell array 210 and the voltage generator 220. As described above, the memory cell array 210 may include nonvolatile memory cells. For example, the memory cell array 210 may include flash memory cells. Also, the flash memory cells may be realized in various forms. For example, the memory cell array 210 may include three-dimensional (or vertical) NAND (or VNAND) memory cells.

Figure 2:
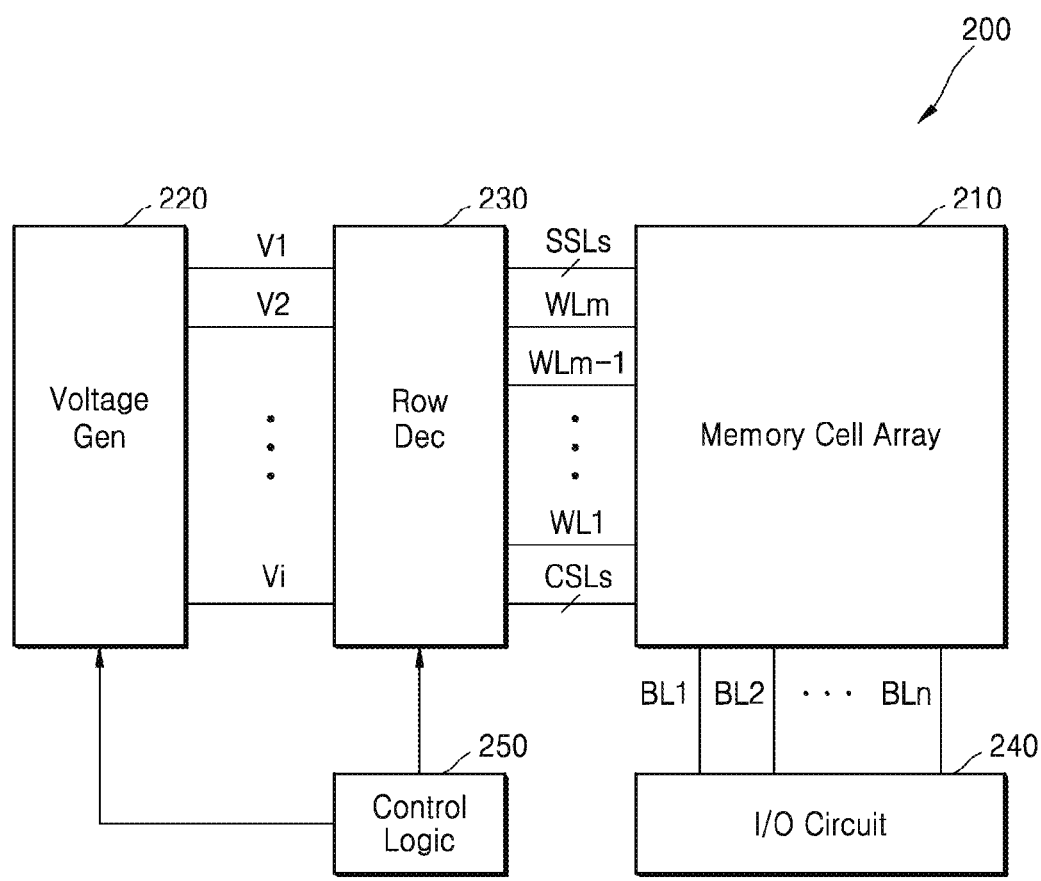
FIG. 2 is a block diagram of a memory device illustrated in FIG. 1, according to an embodiment.

FIG. 2 is a block diagram of the memory device 200 illustrated in FIG. 1, according to an embodiment. Referring to FIG. 2, the memory device 200 may further include a row decoder 230, an input and output circuit 240, and a control logic 250.

The memory cell array 210 may be connected to one or more string selection lines SSLs, a plurality of word lines WL1 through WLm, one or more common source line CSLs, and a plurality of bit lines BL1 through BLn. The voltage generator 220 may generate one or more word line voltages V1 through Vi, and the word line voltages V1 through Vi may be provided to the row decoder 230. Signals for programming/reading/erasing operations may be applied to the memory cell array 210 through the bit lines BL1 through BLn.

Also, data to be programmed may be provided to the memory cell array 210 through the input and output circuit 240, and read data may be provided to the outside (for example, a memory controller, such as the memory controller 100 in FIG. 1) through the input and output circuit 240. The control logic 250 may provide various control signals related to memory operations to the row decoder 230 and the voltage generator 220.

According to a decoding operation of the row decoder 230, the word line voltages V1 through Vi may be provided to various lines SSLs, WL1 through WLm, and CSLs. For example, the word line voltages V1 through Vi may include a string selection voltage, a word line voltage, and ground selection voltage. The string selection voltage may be provided to one or more string selection lines SSLs, the word line voltage may be provided to one or more word lines WL1 through WLm, and the ground selection voltage may be provided to one or more common source lines CSLs.

Figure 3:
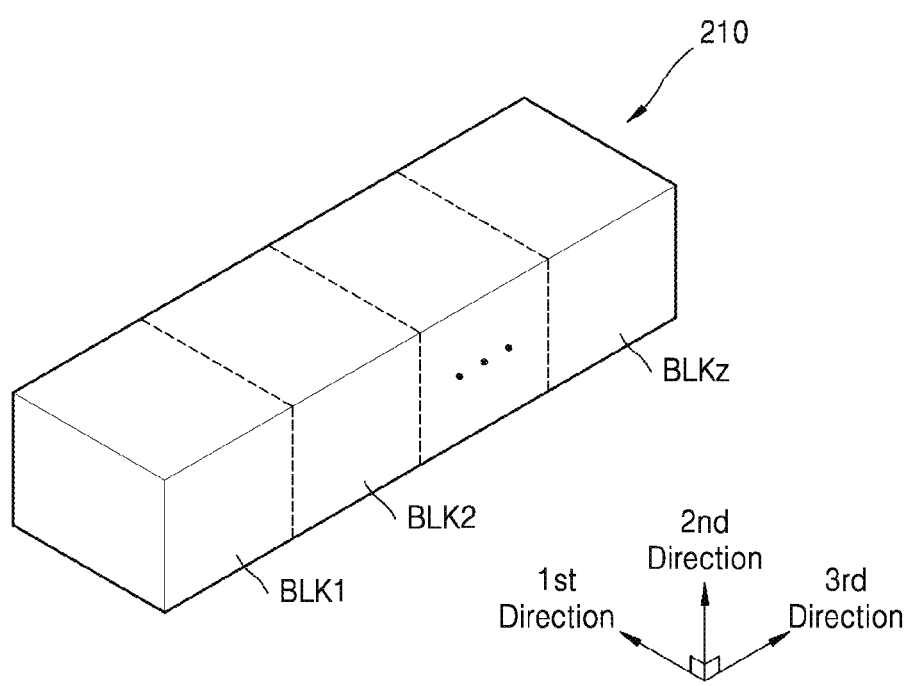
FIG. 3 is a block diagram of a memory cell array illustrated in FIG. 1, according to an embodiment.

FIG. 3 is a block diagram of the memory cell array 210 illustrated in FIG. 1. Referring to FIG. 3, the memory cell array 210 may include a plurality of memory blocks BLK1 through BLKz. Each of the memory blocks BLK1 through BLKz may have a three-dimensional structure (or a vertical structure). For example, each memory block BLK may include a structure extending in first through third directions. For example, each memory block BLK may include a plurality of memory cell strings extending in the second direction. Also, the plurality of memory cell strings may be two-dimensionally arranged in the first and third directions. Each memory cell string may be connected to the bit line BL, the string selection line SSL, the word lines WLs, and the common source line CSL. Thus, each of the memory blocks BLK1 through BLKz may be connected to the plurality of bit lines BLs, the plurality of string selection lines SSLs, the plurality of word lines WLs, and the plurality of common source lines CSLs. The memory blocks BLK1 through BLKz will be described in further detail with reference to FIG. 4.

Figure 4:
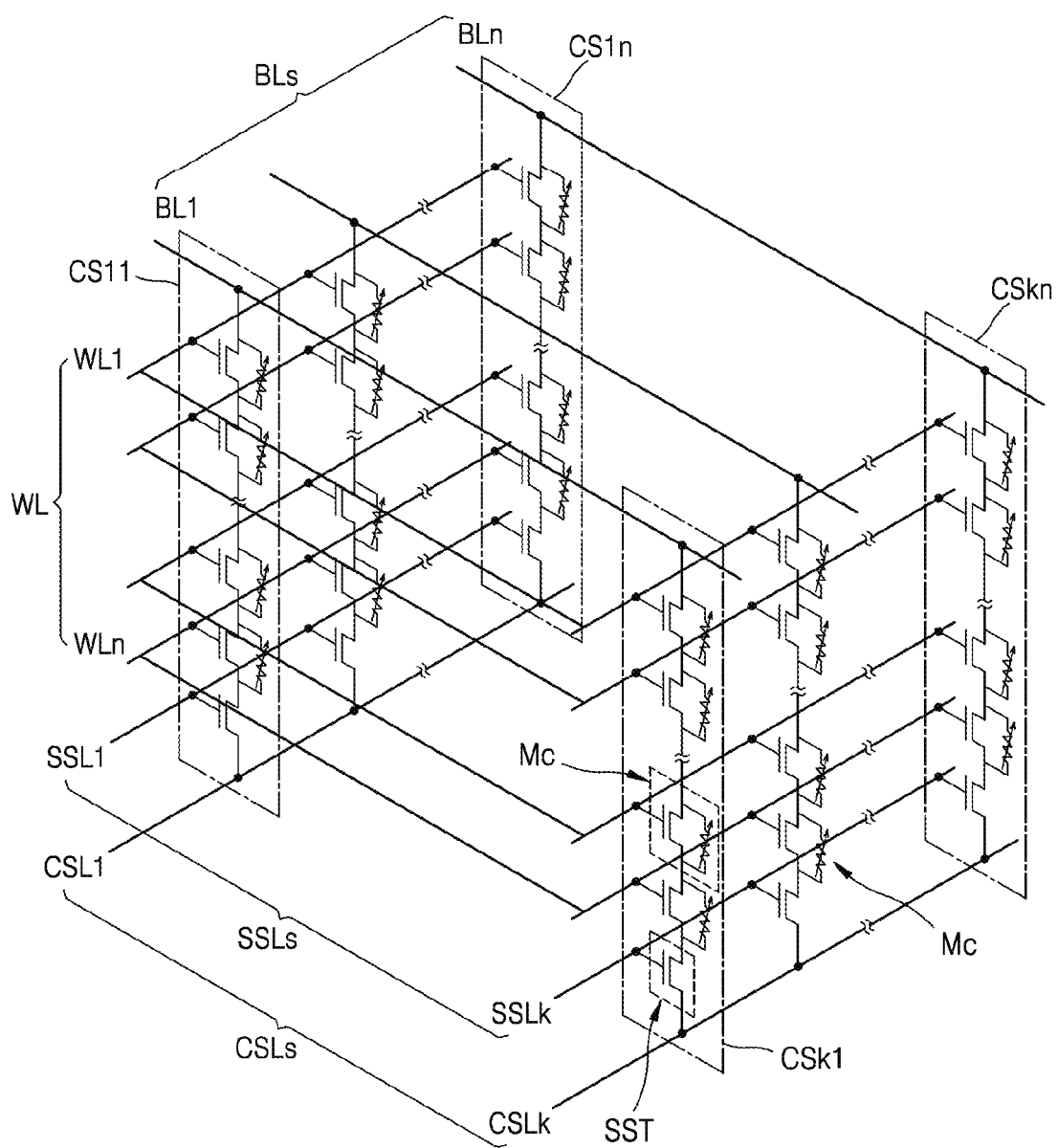
FIG. 4 is a circuit diagram of an equivalent circuit corresponding to a memory block, according to an embodiment.

FIG. 4 is a circuit diagram of an equivalent circuit corresponding to a memory block, according to an embodiment. For example, one of the memory blocks BLK1 through BLKz of the memory cell array 210 of FIG. 3 is illustrated in FIG. 4. Referring to FIGS. 3 and 4, each of the memory blocks BLK1 through BLKz may include a plurality of memory cell strings CS11 through CSkn. The plurality of memory cell strings CS11 through CSkn may be two-dimensionally arranged in a row direction and a column direction, thereby forming rows and columns. Each of the memory cell strings CS11 through CSkn may include a plurality of memory cells MCs and a plurality of string selection transistors SSTs. The memory cells MCs and the string selection transistors SSTs of each of the memory cell strings CS11 through CSkn may be stacked in a height direction.

Rows of the plurality of memory cell strings CS11 through CSkn may be connected to a plurality of string selection lines SSL1 through SSLk, respectively. For example, the string selection transistors SSTs of the memory cell strings CS11 through CS1$n$ may be commonly connected to the string selection line SSL1. The string selection transistors SSTs of the memory cell strings CSk1 through CSkn may be commonly connected to the string selection line SSLk.

Also, columns of the plurality of memory cell strings CS11 through CSkn may be connected to the plurality of bit lines BL1 through BLn, respectively. For example, the memory cells MCs and the string selection transistors SSTs of the memory cell strings CS11 through CSk1 may be commonly connected to the bit line BL1, and the memory cells MCs and the string selection transistors SSTs of the memory cell strings CS1$n$ through CSkn may be commonly connected to the bit line BLn.

Also, the rows of the plurality of memory cell strings CS11 through CSkn may be connected to the plurality of common source lines CSL1 through CSLk, respectively. For example, the string selection transistors SSTs of the plurality of memory cell strings CS11 through CS1$n$ may be commonly connected to the common source line CSL1, and the string selection transistors SST of the plurality of memory cell strings CSk1 through CSkn may be commonly connected to the common source line CSLk.

The memory cells MC located at the same height from a substrate (or the string selection transistors SSTs) may be commonly connected to one word line WL, and the memory cells MC located at different heights from the substrate (or the string selection transistors SSTs) may be connected to the plurality of word lines WL1 through WLm, respectively.

The memory block illustrated in FIG. 4 is an example. The disclosure is not limited to the memory block illustrated in FIG. 4. For example, the number of rows of the plurality of memory cell strings CS11 through CSkn may be increased or decreased. When the number of rows of the plurality of memory cell strings CS11 through CSkn is changed, the number of string selection lines connected to the rows of the memory cell strings CS11 through CSkn and the number of memory cell strings CS11 through CSkn connected to one bit line may also be changed. When the number of rows of the memory cell strings CS11 through CSkn is changed, the number of common source lines connected to the rows of the memory cell strings CS11 through CSkn may also be changed. Also, the number of columns of the memory cell strings CS11 through CSkn may be increased or decreased. When the number of columns of the memory cell strings CS11 through CSkn is changed, the number of bit lines connected to the columns of the memory cell strings CS11 through CSkn and the number of memory cell strings CS11 through CSkn connected to one string selection line may also be changed.

A height of each of the memory cell strings CS11 through CSkn may be increased or decreased. For example, the number of memory cells MC stacked in each of the memory cell strings CS11 through CSkn may be increased or decreased. When the number of memory cells MC stacked in each of the memory cell strings CS11 through CSkn is changed, the number of word lines WL may also be changed. For example, the number of string selection transistors SSTs provided to each of the memory cell strings CS11 through CSkn may be increased. When the number of string selection transistors SSTs provided to each of the memory cell strings CS11 through CSkn is changed, the number of string selection lines or the number of common source lines may also be changed. When the number of string selection transistors SSTs is increased, the string selection transistors SSTs may be stacked in a shape that is the same as the shape in which the memory cells MC are stacked.

For example, writing and reading operations may be performed for each row of the memory cell strings CS11 through CSkn. The memory cell strings CS11 through CSkn may be selected for each row by the common source lines CSLs, and the memory cell strings CS11 through CSkn may be selected for each row by the string selection lines SSLs. Also, the writing and reading operations may be performed for each page, in a selected row of the memory cell strings CS11 through CSkn. For example, the page may be one row of the memory cells MC connected to one word line WL. In the selected row of the memory cell strings CS11 through CSkn, the memory cells MCs may be selected for each page by the word lines WL.

Figure 5:
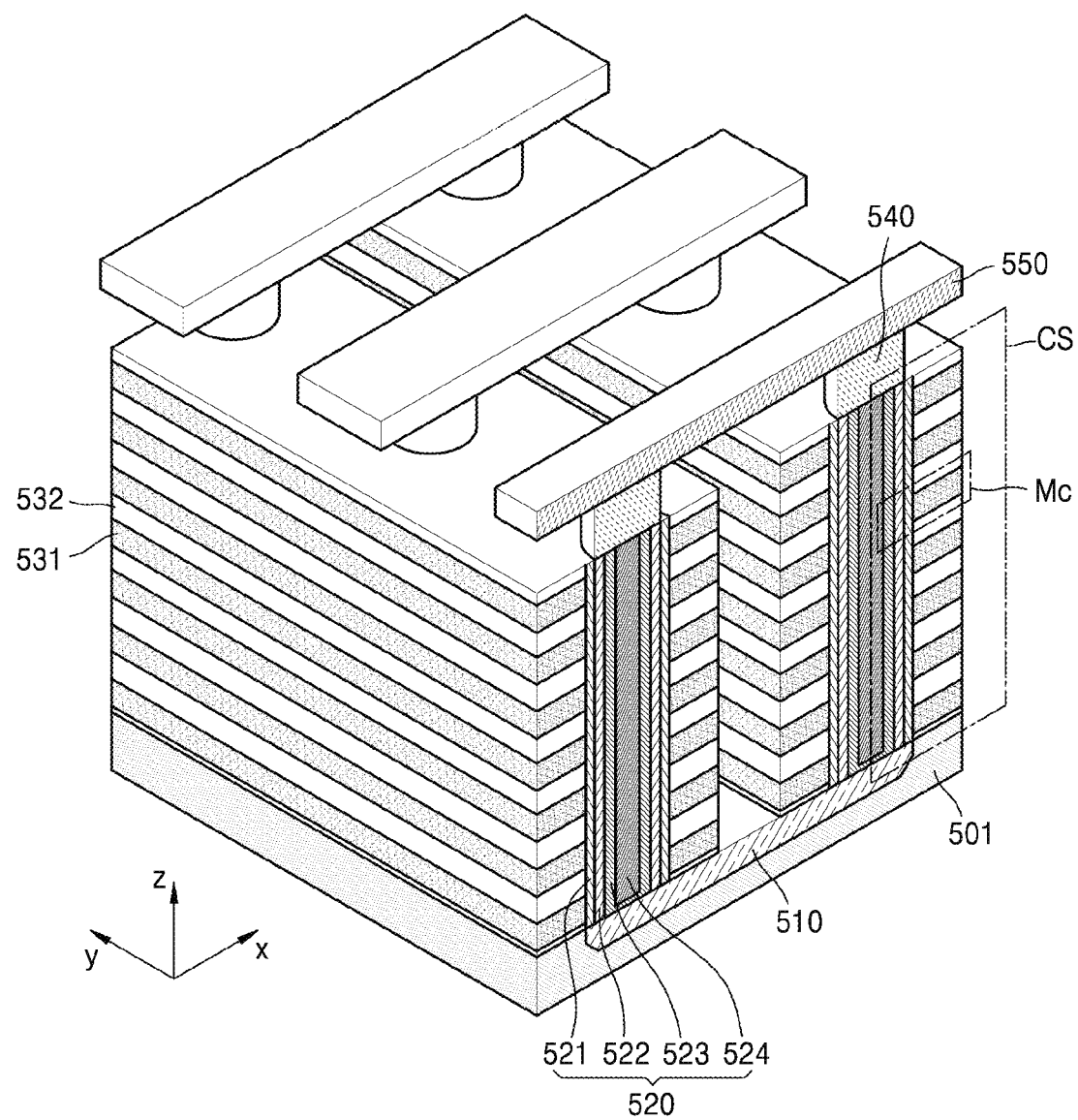
FIG. 5 is a schematic perspective view of a physical structure corresponding to a memory block, according to an embodiment.
Figure 6A:
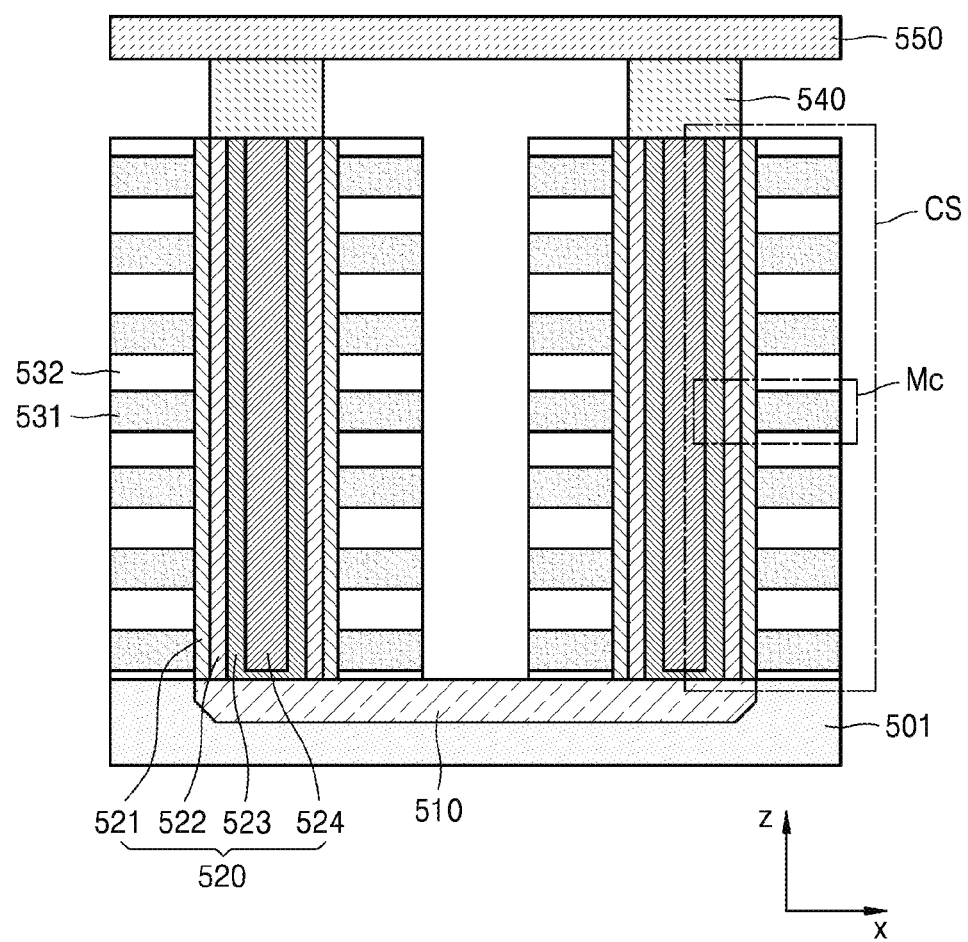
FIG. 6A is a cross-sectional view of the memory block of FIG. 5 in an X-Z plane according to an embodiment.
Figure 6B:
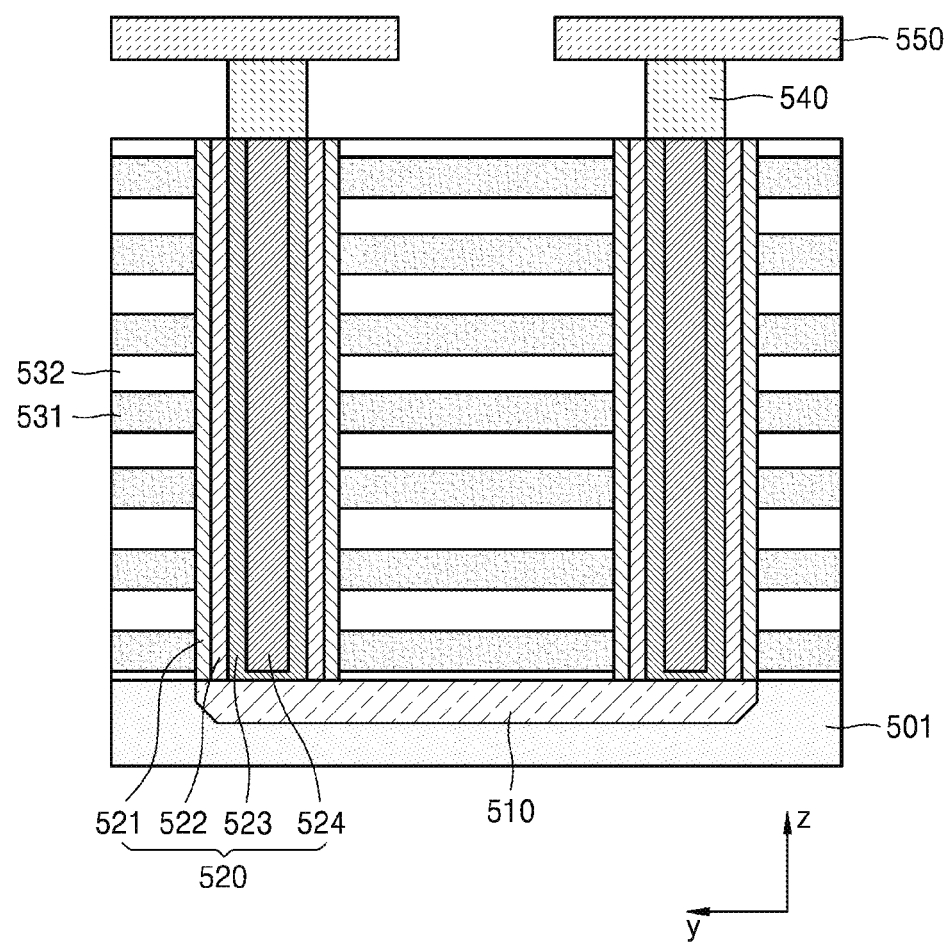
FIG. 6B is a cross-sectional view of the memory block of FIG. 5 in a Y-Z plane according to an embodiment.

Each of the memory cells MCs in each of the memory cell strings CS11 through CSkn may correspond to a circuit in which a transistor and a resistor are connected in parallel. For example, FIG. 5 is a schematic perspective view of a physical structure corresponding to a memory block, according to an embodiment. FIG. 6A is a cross-sectional view of the memory block of FIG. 5 in an X-Z plane. FIG. 6B is a cross-sectional view of the memory block of FIG. 5 in a Y-Z plane.

Referring to FIGS. 5, 6A, and 6B, the memory block may include a substrate 501. The substrate 501 may include a silicon material doped with a first type impurity. For example, the substrate 501 may include a silicon material doped with a p-type impurity. The substrate 501 may be, for example, a p-type well (for example, a pocket p-well). Hereinafter, it is assumed that the substrate 501 includes p-type silicon. However, the substrate 501 is not limited to p-type silicon.

A doped region 510 may be formed in an upper region of the substrate 501. For example, the doped region 510 may have a second type, which is electrically opposite to the first type of the substrate 501. For example, the doped region 510 may have an n-type. Hereinafter, it is assumed that the doped region 510 is the n-type. However, the doped region 510 is not limited to the n-type. The doped region 510 may become a common source line.

A plurality of gates 531 extending in a horizontal direction and a plurality of insulators 532 extending in the horizontal direction may be alternately arranged on the substrate 501. In other words, the plurality of gates 531 and the plurality of insulators 532 may be alternately stacked in a vertical direction orthogonal to the horizontal direction. For example, the gates 531 may include at least one of a metal material (for example, copper, silver, etc.) and silicon doped in a high concentration, and the plurality of insulators 532 may include silicon oxide. However, the gates 531 and the plurality of insulators 532 are not limited thereto. Each of the gates 531 may be connected to one of a word line WL and a string selection line SSL.

Also, the memory block may include a plurality of pillars 520 perpendicularly penetrating the plurality of gates 531 and the plurality of insulators 532, which are alternately arranged in the vertical direction. Each of the pillars 520 may include a plurality of layers in the horizontal direction. According to an embodiment, an outermost layer of the pillar 520 may include a gate insulating layer 521. For example, the gate insulating layer 521 may include silicon oxide. The gate insulating layer 521 may be conformally deposited on the plurality of gates 531 and the plurality of insulators 532 and may extend in the vertical direction.

Also, a semiconductor layer 522 may be conformally deposited along a surface of the gate insulating layer 521 and may extend in the vertical direction. According to an embodiment, the semiconductor layer 522 may include a silicon material doped with a first type. The semiconductor layer 522 may include a silicon material doped with the same type as the silicon material of the substrate 501. For example, when the substrate 501 includes a silicon material doped with a p-type, the semiconductor layer 522 may also include the silicon material doped with the p-type. Alternatively, the semiconductor layer 522 may include a material, such as Ge, indium gallium zinc oxide (IGZO), or GaAs.

A resistance change layer 523 may be conformally deposited along a surface of the semiconductor layer 522 and may extend in the vertical direction. The resistance change layer 523 may be formed by thinly depositing a metal-semiconductor oxide along the surface of the semiconductor layer 522, the metal-semiconductor oxide including a mixture of a semiconductor material and a transition metal oxide material. According to an embodiment, the resistance change layer 523 may include a material having a resistance varying according to a voltage applied thereto. The resistance change layer 523 may be changed from a high resistance state to a low resistance state or from a low resistance state to a high resistance state, according to a voltage applied thereto.

The metal-semiconductor oxide in the resistance change layer 523 may have an anti-site defect due to inversion of a site between the semiconductor material and the transition metal. A charge trap formed due to the anti-site defect may provide a resistance change of the resistance change layer 523. For example, when an electron is trapped in the charge trap formed in the resistance change layer 523 due to the anti-site defect, a resistance of the resistance change layer 523 may be decreased, and when an electron is de-trapped from the charge trap formed due to the anti-site defect, the resistance of the resistance change layer 523 may be increased. Also, a plurality of movable oxygen vacancies distributed in the metal-semiconductor oxide of the resistance change layer 523 may also provide a resistance change of the resistance change layer 523. For example, a resistance state of the resistance change layer 523 may be easily changed based on a phenomenon in which an electron is trapped in or de-trapped from a charge trap formed due to the oxygen vacancies.

The transition metal oxide constituting the resistance change layer 523 may include, for example, $Ta_2O_5$, BaO, $TiO_2$, and the like. Also, the semiconductor material constituting the resistance change layer 523 may include, for example, Si, Ge, IGZO, GaAs, and the like. When silicon (Si) is used as the semiconductor material, the metal-semiconductor oxide of the resistance change layer 523 may include, for example, a Ta-silicate, a Ba-silicate, a Ti-silicate, and the like. As another example, when germanium (Ge) is used as the semiconductor material, the metal-semiconductor oxide of the resistance change layer 523 may include $TaGe_xO_y$, $BaGe_xO_y$, $TiGe_xO_y$, and the like. Here, x and y may vary according to a ratio between the semiconductor material and the transition metal oxide.

In order that a sufficient amount of the charge trap is formed in the resistance change layer 523, a ratio of the semiconductor material to the resistance change layer 523 may be appropriately selected. For example, the ratio of the semiconductor material to the resistance change layer 523 may be about 20 at. % to about 80 at. %, though the ratio of the semiconductor material may vary according to amounts of the transition metal oxide and the semiconductor material which are used. Or, the ratio of the semiconductor material to the resistance change layer 523 may be, for example, about 40 at. % to about 60 at. %. In other words, a concentration of the semiconductor material in the resistance change layer 523 may be about 20 at. % to about 80 at. % and/or about 40 at. % to about 60 at. %.

The resistance change layer 523 may be formed to have a small thickness in an x-direction so that the resistance change layer 523 has a uniform characteristics throughout the entire area of the resistance change layer 523. For example, a thickness of the resistance change layer 523 in the x-direction may be in the range of about 0.1 nm to about 2.0 nm. Or, the thickness of the resistance change layer 523 may be in the range of about 0.3 nm to about 1.5 nm. Or, the thickness of the resistance change layer 523 may be in the range of about 0.5 nm to about 1.0 nm. The thickness and the composition of the resistance change layer 523 may be relatively uniform throughout the entire area of the resistance change layer 523. For example, the thickness of the resistance change layer 523 may be approximately constant throughout the entire area of the resistance change layer 523 within a deviation range of about 10%. Also, the metal-semiconductor oxide in the resistance change layer 523 may have a relatively uniform composition throughout the entire area of the resistance change layer 523. For example, the ratio of the semiconductor material to the resistance change layer 523 may be approximately constant throughout the entire area of the resistance change layer 523 within a deviation range of about 10%.

The resistance change layer 523 may be formed by preparing individual metal-semiconductor oxide including the semiconductor material and the transition metal oxide, and then, directly depositing the individual metal-semiconductor oxide along the surface of the semiconductor layer 522. Or, during a process in which the transition metal oxide is deposited along the surface of the semiconductor layer 522, the semiconductor material and the transition metal oxide may be mixed on the surface of the semiconductor layer 522 and then the resistance change layer 523 may be formed.

When the individual metal-semiconductor oxide is directly deposited, a semiconductor material of the semiconductor layer 522 and the semiconductor material of the resistance change layer 523 may be the same as or different from each other. In other words, the semiconductor layer 522 may include a first semiconductor material, and the metal-semiconductor oxide of the resistance change layer 523 may include a second semiconductor material, which is the same as or different from the first semiconductor material. For example, when the semiconductor layer 522 includes Si, the resistance change layer 523 may be formed by directly depositing a Ta-silicate, a Ba-silicate, a Ti-silicate, and the like, or directly depositing $TaGe_xO_y$, $BaGe_xO_y$, $TiGe_xO_y$, and the like, along the surface of the semiconductor layer 522. In the latter case, the first semiconductor material of the semiconductor layer 522 may include Si, and the second semiconductor material of the metal-semiconductor oxide of the resistance change layer 523 may include Ge. As another example, when the semiconductor layer 522 includes Ge, the resistance change layer 523 may be formed by directly depositing $TaGe_xO_y$, $BaGe_xO_y$, $TiGe_xO_y$, and the like, or directly depositing a Ta-silicate, a Ba-silicate, a Ti-silicate, and the like along the surface of the semiconductor layer 522.

When the first semiconductor material of the semiconductor layer 522 and the second semiconductor material of the metal-semiconductor oxide of the resistance change layer 523 are different from each other, a portion of the first semiconductor material may be diffused into the resistance change layer 523 so that the metal-semiconductor oxide may include both of the first semiconductor material and the second semiconductor material. For example, both when the first semiconductor material includes Si and the second semiconductor material includes Ge and when the first semiconductor material includes Ge and the second semiconductor material includes Si, the metal-semiconductor oxide of the resistance change layer 523 may include both of Si and Ge.

When the resistance change layer 523 is formed by thinly depositing the transition metal oxide along the surface of the semiconductor layer 522, the second semiconductor material included in the metal-semiconductor oxide of the resistance change layer 523 may be the same as the first semiconductor material of the semiconductor layer 522. For example, when the semiconductor layer 522 includes Si, and when $Ta_2O_5$, BaO, or $TiO_2$ is thinly deposited along the surface of the semiconductor layer 522, the resistance change layer 523 including a Ta-silicate, a Ba-silicate, or a Ti-silicate may be formed. Also, when the semiconductor layer 522 includes Ge, and when $Ta_2O_5$, BaO, or $TiO_2$ is thinly deposited along the surface of the semiconductor layer 522, the resistance change layer 523 including $TaGe_xO_y$, $BaGe_xO_y$, or $TiGe_xO_y$ may be formed.

When the resistance change layer 523 is formed to have a small thickness as described above, most of the transition metal oxide may be mixed with the semiconductor material in the semiconductor layer 522, and thus, most areas of the resistance change layer 523 may include the metal-semiconductor oxide. As described above, by thinly forming the resistance change layer 523, the thickness and the composition of the resistance change layer 523 may be relatively uniform throughout the entire area of the resistance change layer 523. However, a portion of the transition metal oxide may remain on an edge of the resistance change layer 523 away from an interface between the resistance change layer 523 and the semiconductor layer 522. Likewise in this case, the thickness of the resistance change layer 523 may be defined by including both the metal-semiconductor oxide and the remaining transition metal oxide.

An insulating support 524 may be arranged on an inner side of the resistance change layer 523. For example, the insulating support 524 may include silicon oxide. One memory cell string CS may be include (or constitute) one insulating support 524 and the resistance change layer 523, the semiconductor layer 522, the gate insulating layer 521, the plurality of gates 531, and the plurality of insulators 532. Thus, the insulating support 524 may be arranged at the most central portion of the memory cell string CS. The semiconductor layer 522 and the resistance change layer 523 arranged at an inner surface of the semiconductor layer 522 may be in contact with the doped region 510, that is, a common source area and electrically connected to the common source region. The gates 531 and the insulators 532 arranged at an outer surface of the semiconductor layer 522 may not contact the doped region 510.

A drain 540 may be arranged on the pillar 520. The drain 540 may include a silicon material doped with a second type. For example, the drain 540 may include a silicon material doped with an n-type. A bit line 550 may be arranged on the drain 540. The drain 540 and the bit line 550 may be connected to each other through contact plugs. The bit line 550 may include a metal material. For example, the bit line 550 may include poly silicon. A conductive material may be the bit line 550.

Compared to FIG. 4, the plurality of gates 531, the plurality of insulators 532, the gate insulating layer 521, the semiconductor layer 522, and the resistance change layer 523 may be configuration elements of the memory cell string CS. In detail, the gates 531, the gate insulating layers 521, and the semiconductor layer 522 may be configuration elements of a transistor, and the resistance change layer 523 may be a resistor. Also, one of the plurality of gates 531, and a portion of the gate insulating layer 521, a portion of the semiconductor layer 522, and a portion of the resistance change layer 523, which are adjacent to the one of the plurality of gates 531 in a horizontal direction, may be configuration elements of one memory cell MC. The memory cells MC having this structure may be vertically stacked to form each of the memory cell strings CS.

As described above, the resistance change layer 523 may have a high resistance state or a low resistance state, and thus, "0" and "1" may be written on the memory cell MC. In each memory cell MC, the semiconductor layer 522 of the transistor may be connected in parallel to the resistance change layer 523, and the parallel structures may be continually arranged in a vertical direction to form the memory cell string CS. Also, the common source line 510 and the bit line 550 may be connected to both ends of the memory cell string CS, respectively. Also, programming, reading, and erasing operations may be performed on the plurality of memory cells MC by applying voltages to the common source line 510 and the bit line 550.

According to the present embodiment, rather than forming the memory block by using a phase-change material, the memory block may be formed by using the resistance change layer 523, to improve heat generation, stress (pressure), and the like, which may occur when using the phase-change material. Also, by forming the memory block and operating the memory block as described in detail above, even when the memory cells included in the memory block are repeatedly operated, an ion movement between adjacent memory cells, and a current leakage, an operation failure etc. due to the ion movement may be limited and/or prevented. Also, the memory block according to the present embodiment may solve scaling issues between memory cells in a next generation VNAND structure, so as to significantly increase the density. Thus, a memory capacity may be greatly increased. In detail, the metal-semiconductor oxide included in the resistance change layer 523 according to the present embodiment, may have good uniformity and good on/off current ratios, as described below, and thus, a resistance state may be relatively more easily and accurately changed, and a multi-level cell (MLC) may be realized.

The memory block according to the present embodiment may be realized in the form of a chip and may be used as a neuromorphic computing platform. Also, the memory block according to the disclosure may be realized in the form of a chip and may be used to form a neural network.

Figure 7A:
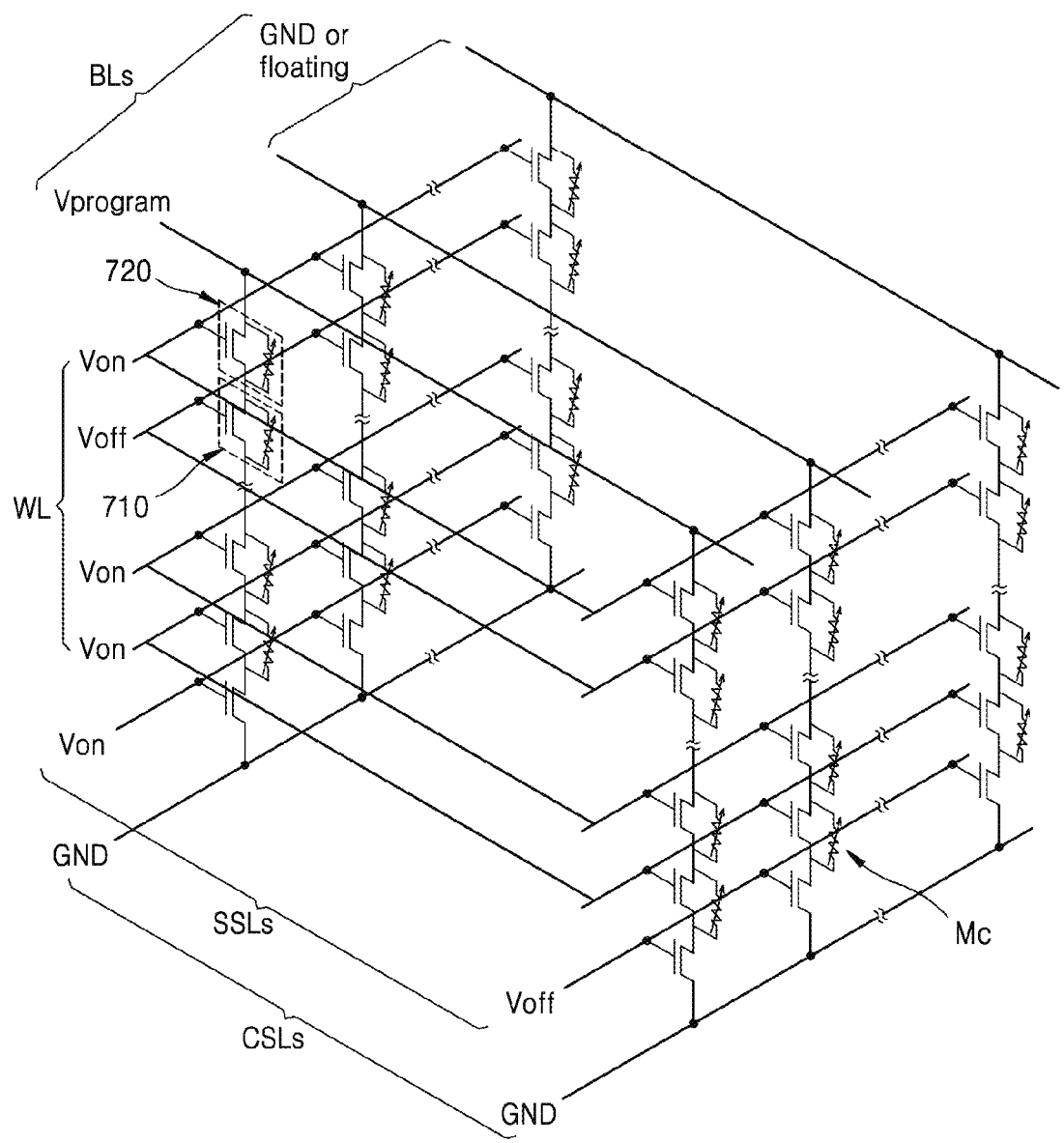
FIGS. 7A and 7C are circuit diagrams of an equivalent circuit of the memory block of FIG. 4 in a program mode of a nonvolatile memory device, according to an embodiment.
Figure 7B:
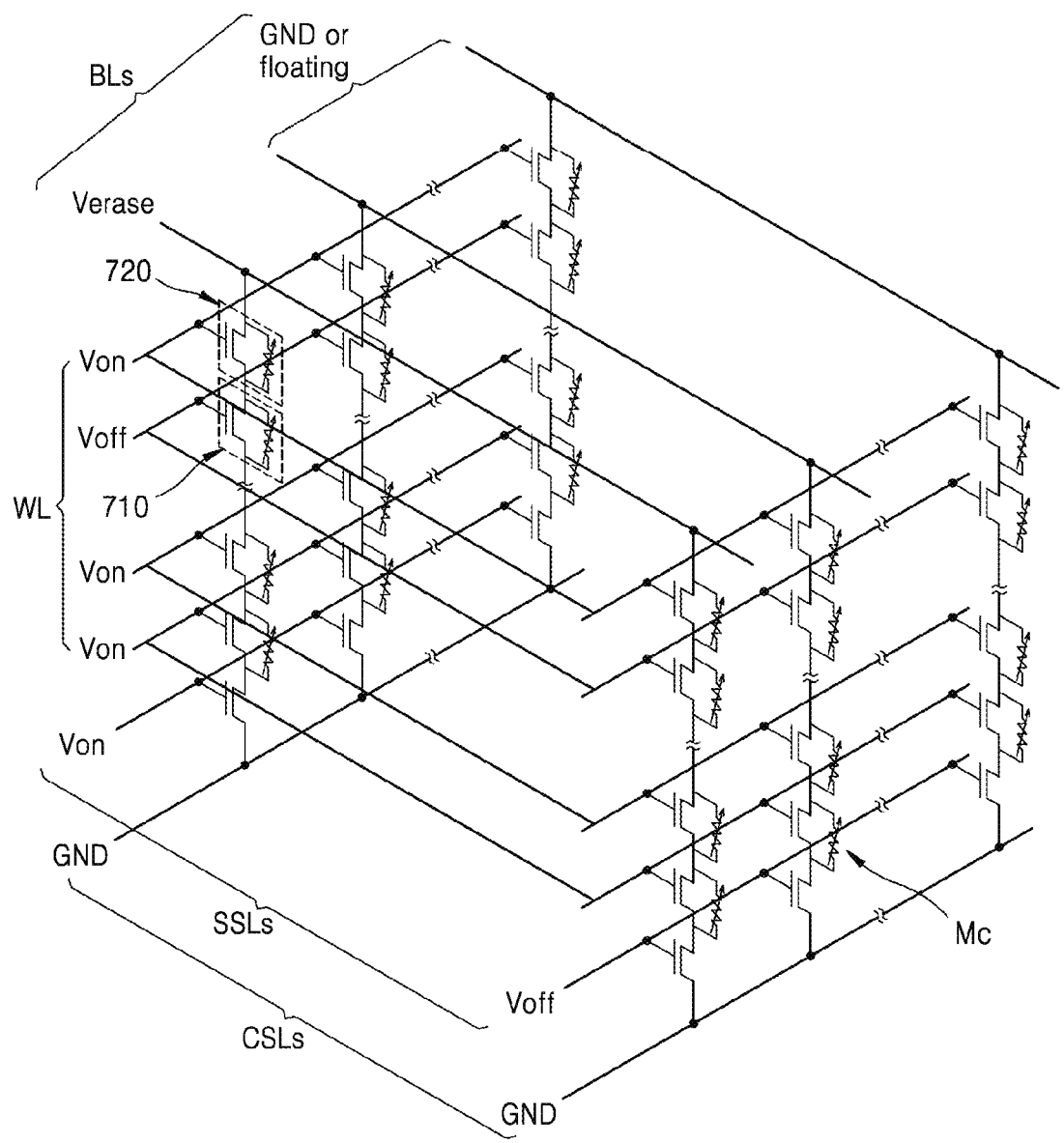
FIGS. 7B and 7D are circuit diagrams of an equivalent circuit of the memory block of FIG. 4 in an erase mode of a nonvolatile memory device, according to an embodiment.
Figure 7C:
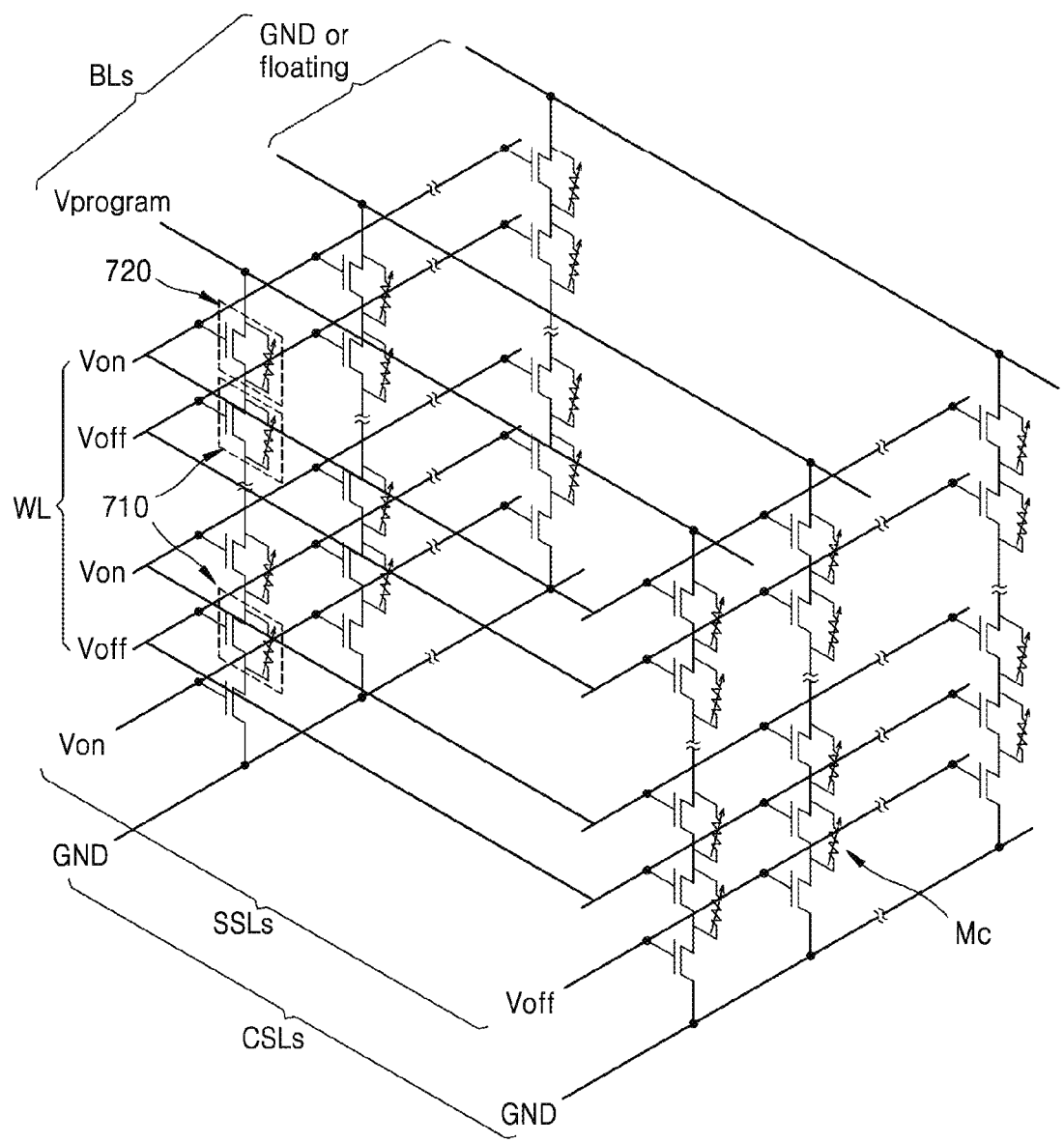
Figure 7D:
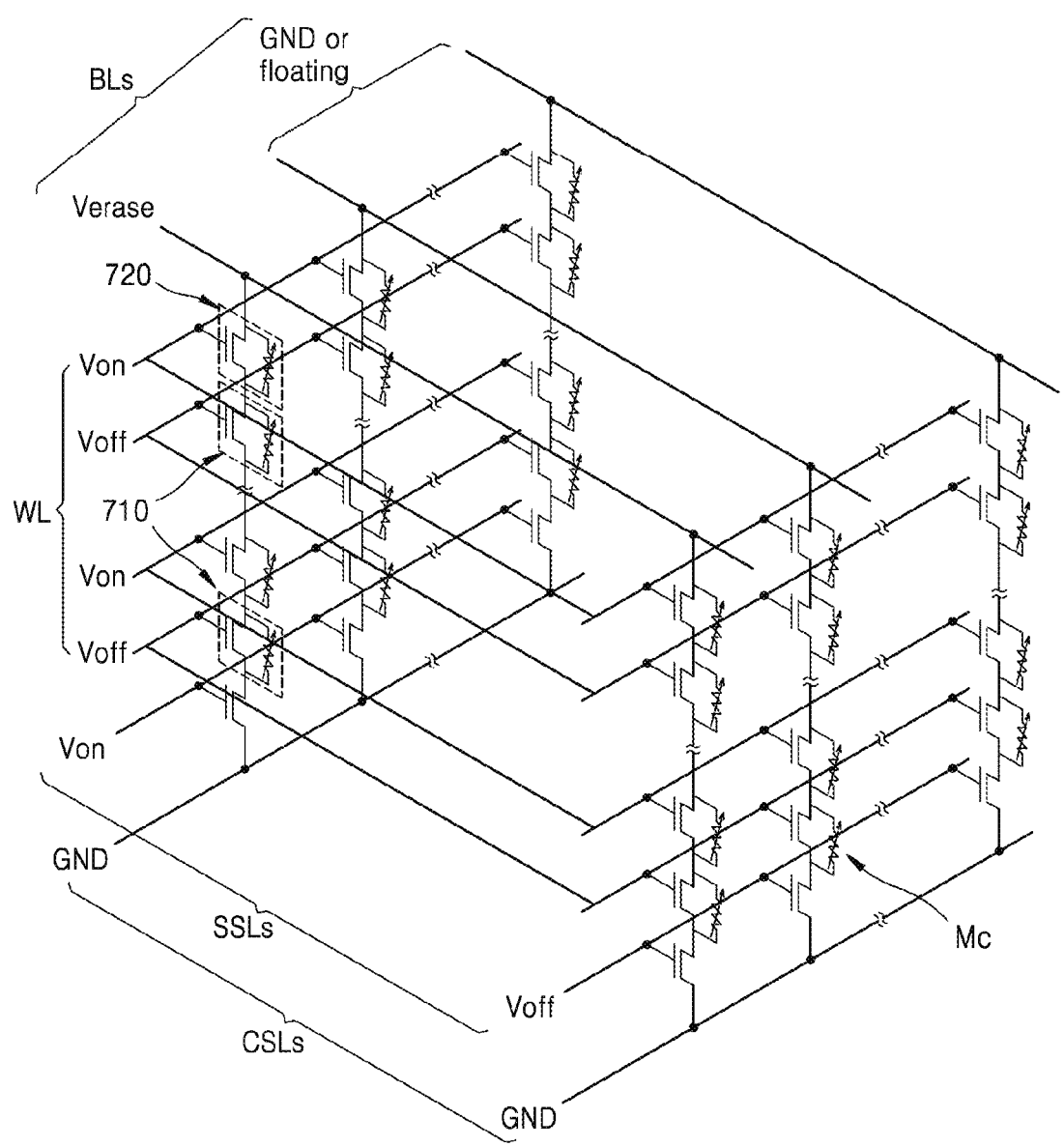

FIGS. 7A and 7C are circuit diagrams of an equivalent circuit of the memory block of FIG. 4 in a program mode of a nonvolatile memory device, according to an embodiment. FIGS. 7B and 7D are circuit diagrams of an equivalent circuit of the memory block of FIG. 4 in an erase mode of a nonvolatile memory device, according to an embodiment.

Each of a plurality of memory cells 710 and 720 illustrated in FIGS. 7A to 7D may include the gate 531, the gate insulating layer 521, the semiconductor layer 522, and the resistance change layer 523 illustrated in FIG. 5.

The plurality of memory cells 710 and 720 of the memory block may be divided into a selected memory cell 710 and a non-selected memory cell 720. Referring to FIGS. 7A and 7C, the program mode of the nonvolatile memory device may indicate a mode, in which a program operation is performed on memory cells included in the memory block. Also, the selected memory cell 710 may indicate the memory cell on which the program operation is to be performed. FIG. 7A illustrates an example where one selected memory cell 710 of a memory cell string CS is programmed, but example embodiments are not limited thereto. As depicted in FIG. 7C, in an embodiment, two selected memory cells 710 may be programmed at the same time in a same memory cell string CS.

Referring to FIGS. 2, 4, 7A and 7C, the control logic 250 may control a turn-on voltage Von to be applied to a string selection line SSL connected to the memory cell string CS including selected memory cell(s) 710 from among the plurality of string selection lines SSLs. The control logic 250 may apply a turn-on voltage Von to a word line WL connected to the non-selected memory cells 720 from among the plurality of word lines WLs and apply a turn-off voltage Voff to each word line WL connected to each selected memory cell 710 from among the plurality of word lines WLs. Here, the turn-on voltage Von is a voltage having a value to turn on the transistor and may also be referred to as a voltage that causes a current to flow through only a semiconductor layer of the transistor. The turn-off voltage Voff is a voltage having a value to turn off the transistor and may also be referred to as a voltage that limits and/or prevents a current from flowing through the semiconductor layer of the transistor. The values of the turn-on voltage Von and the turn-off voltage Voff may be dependent on types of materials, thicknesses, etc. of the gates 531, the gate insulating layers 521, the semiconductor layer 522, and the resistance change layer 523 which configure the plurality of memory cells MCs. Generally, an absolute value of the turn-on voltage Von may be greater than an absolute value of the turn-off voltage Voff.

Also, a program voltage Vprogram may be applied to a bit line BL connected to the memory cell string including the selected memory cell 710 from among the plurality of bit lines BLs. The program voltage Vprogram may be provided through the input and output circuit 240 from the outside, for example, the memory controller 100. The program voltage Vprogram may be a voltage for writing data on the memory cell MC and a value of the program voltage Vprogram may change depending on the data.

Bit lines BLs that are not connected to the selected memory cells 710 from among the plurality of bit lines BLs may be grounded or floated. When the bit lines BLs that are not connected to the selected memory cell 710 are grounded or floated, power loss due to a current leakage may be limited and/or prevented. Then, the control logic 250 may perform a program operation on the selected memory cell 710.

In the program mode, as the turn-on voltage Von is applied to the non-selected memory cell 720, the semiconductor layer 522 of the non-selected memory cell 720 may have a conductive characteristics, and as the turn-off voltage Voff is applied to the selected memory cell 710, the semiconductor layer 522 of the selected memory cell 710 may have an insulating characteristics. Thus, a voltage difference due to the program voltage Vprogram may occur in the selected memory cell 710. Due to the voltage difference in the selected memory cell 710, an electron may be trapped in a charge trap in the resistance change layer 523 of the selected memory cell 710, so that the resistance change layer 523 may be changed into a low resistance state. Also, oxygen vacancies in the resistance change layer 523 may be shifted in a direction of the semiconductor layer 522, so that the resistance change layer 523 may be changed into a low resistance state. That the resistance change layer 523 of the selected memory cell 710 may be changed into the low resistance state may denote that a value of the resistance included in the selected memory cell 710 may be decreased. The selected memory cell(s) 710 may have an ohmic conductive characteristics in the low resistance state of the resistance change layer 523.

Figure 8:
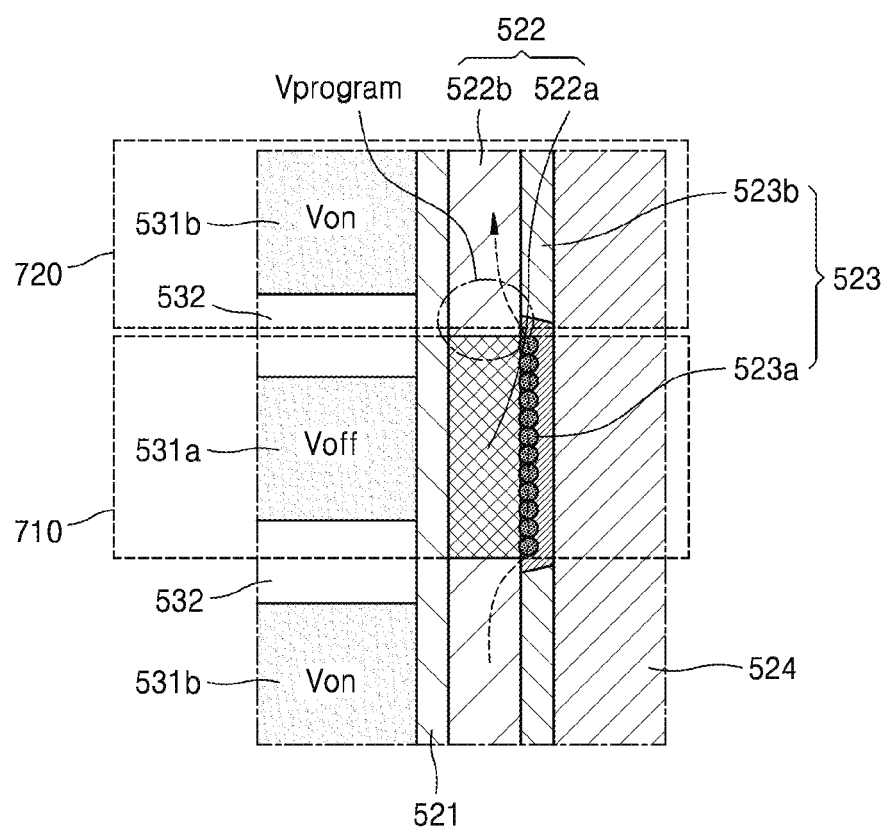
FIG. 8 is a schematic diagram for describing a current movement in a resistance change layer in a program mode, according to an embodiment.

FIG. 8 is a schematic diagram for describing a current movement in the resistance change layer 523 in a program mode, according to an embodiment. Referring to FIG. 8, the memory block may include the gates 531, the insulators 532, the gate insulating layer 521, the semiconductor layer 522, the resistance change layer 523, and the insulating support 524. The gate insulating layer 521, the semiconductor layer 522, the resistance change layer 523, and the insulating support 524 may extend in a vertical direction. The gates 531 and the insulators 532 may extend in a horizontal direction and may be alternately stacked in the vertical direction. The gates 531, the gate insulating layer 521, and the semiconductor layer 522 may be included in a transistor, and the resistance change layer 523 may correspond to a resistor.

In the program mode, the control logic 250 may perform a controlling operation to apply a turn-on voltage Von to a gate 531b of the non-selected memory cell 720 and apply a turn-off voltage Voff to a gate 531a of the selected memory cell 710. Then, a semiconductor layer 522b corresponding to the gate 531b of the non-selected memory cell 720 may have a conductive characteristics, and a semiconductor layer 522a corresponding to the gate 531a of the selected memory cell 710 may have an insulating characteristics. When a positive (+) program voltage Vprogram is applied to a bit line electrically connected to the selected memory cell 710, a voltage difference may occur between an upper portion and a lower portion of a resistance change layer 523a corresponding to the selected memory cell 710.

This voltage difference may cause an electron to be trapped in a charge trap formed due to an anti-site defect in the metal-semiconductor oxide of the resistance change layer 523a corresponding to the selected memory cell 710. Also, oxygen vacancies in the resistance change layer 523a may be shifted in a direction of the semiconductor layer 522a. Based on these phenomena, as illustrated in FIG. 8, a conductive filament may be formed on an interface between the resistance change layer 523a and the semiconductor layer 522a. Thus, due to a change of current conduction, the resistance change layer 523a corresponding to the selected memory cell 710 may be changed into a low resistance state. Here, the selected memory cell 710 may have an ohmic conductive characteristics. In other words, the selected memory cell 710 may have a bulk conductive characteristics, such as hopping, space charge limited current (SCLC), or Poole-Frenkel. As a result, because the resistance change layer 523a of the selected memory cell 710 may have a changed resistance state according to the program voltage Vprogram, a program operation may be performed on the selected memory cell 710.

On the contrary, the voltage difference may not occur between an upper portion and a lower portion of the resistance change layer 523b of the non-selected memory cell 720. Thus, an electron may not be trapped in a charge trap in the resistance change layer 523b corresponding to the non-selected memory cell 720, and oxygen vacancies may not move.

Referring to FIGS. 7B and 7D, in an erase mode, a negative (−) erase voltage Verase may be applied to the bit line electrically connected to the selected memory cell 710. Then, the electron may be de-trapped from the charge trap in the metal-semiconductor oxide of the resistance change layer 523a corresponding to the selected memory cell(s) 710, and the oxygen vacancies may be dispersed, so that the resistance change layer 523a corresponding to the selected memory cell 710 may be changed into a high resistance state. FIG. 7B illustrates a non-limiting example where one memory cell is the selected memory cell 710 that is erased in the memory cell string CS. FIG. 7D illustrates a non-limiting example where two memory cells are a selected memory cell 710 that is erased by applying Verase to the selected bit line BL while Voff is applied to the word line WL connected to the selected memory cell. However, example embodiments are not limited thereto.

Figure 9:
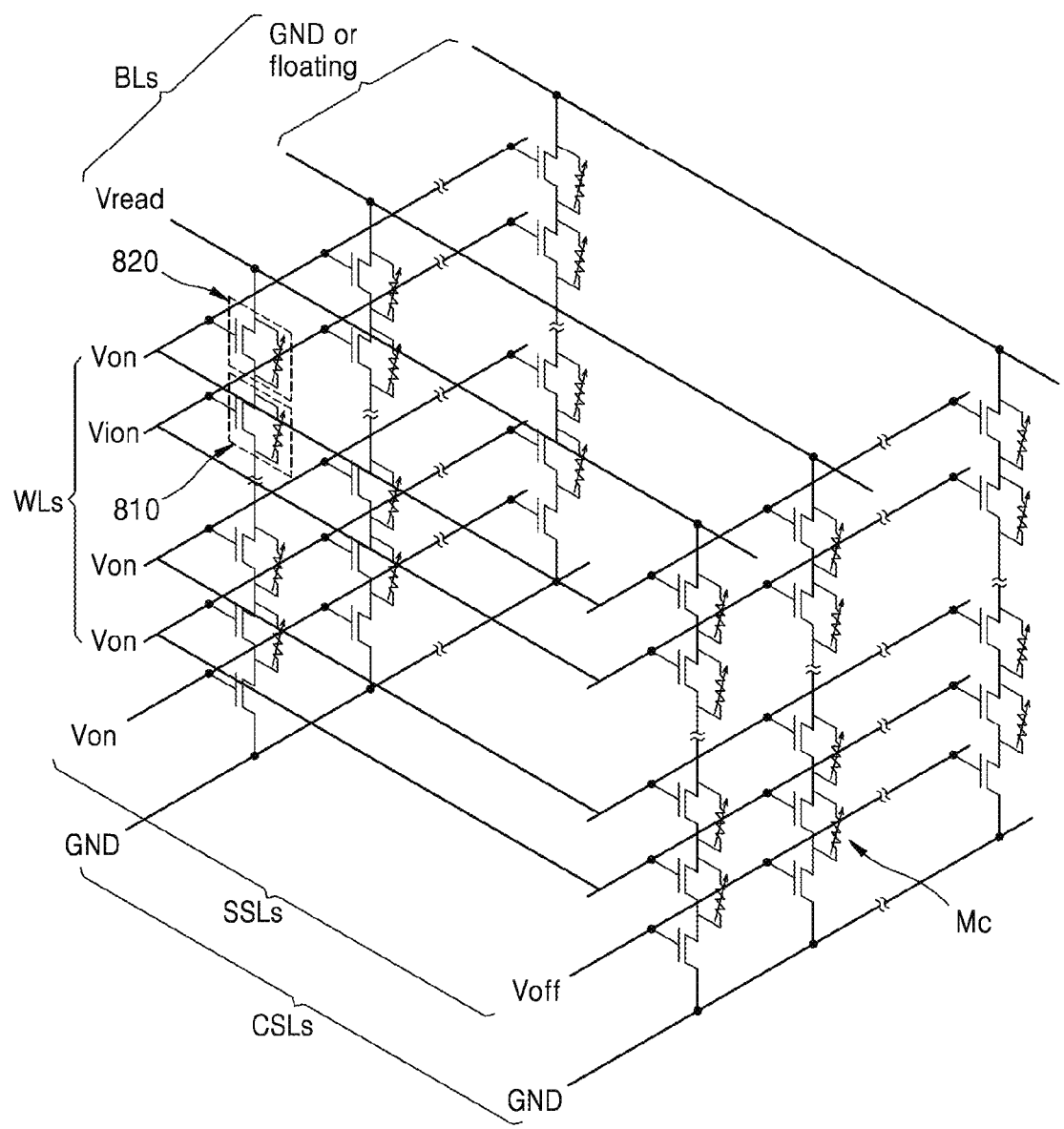
FIG. 9 is a circuit diagram of a circuit in a read mode of a memory block, according to an embodiment.

FIG. 9 is a circuit diagram of a circuit in a read mode of a memory block, according to an embodiment. Each of a plurality of memory cells 810 and 820 illustrated in FIG. 9 may include the gate 531, the gate insulating layer 521, the semiconductor layer 522, and the resistance change layer 523 illustrated in FIG. 5. The plurality of memory cells 810 and 820 of the memory block may be divided into a selected memory cell 810 and a non-selected memory cell 820. A read mode of a nonvolatile memory device may denote a mode in which a read operation is performed on memory cells included in the memory block, and the selected memory cell 810 may denote the memory cells on which the read operation is to be performed.

In the read mode, the control logic 250 may apply a turn-on voltage Von to a string selection line SSL connected to the selected memory cell 810, from among a plurality of string selection lines SSLs, and apply a turn-on voltage Von to a word line WL connected to the non-selected memory cells 820, from among a plurality of word lines WLs. Here, the turn-on voltage Von may be a voltage having a value to turn-on a transistor and may also be referred to as a voltage that causes a current to flow through only the semiconductor layer 522 of the transistor. The turn-off voltage Voff may be a voltage having a value to turn-off the transistor and may also be referred to as a voltage that limits and/or prevents a current from flowing through the semiconductor layer 522 of the transistor. The values of the turn-on voltage Von and the turn-off voltage Voff may be dependent upon types of materials, thicknesses, etc. of the gates 531, the gate insulating layer 521, the semiconductor layer 522, and the resistance change layer 523 that configure the plurality of memory cells MCs. Generally, an absolute value of the turn-on voltage Von may be greater than an absolute value of the turn-off voltage Voff.

Also, the control logic 250 may apply a current-on voltage Vion to a word line WL connected to the selected memory cell 810. The current-on voltage Vion may denote a voltage having a value that is sufficient to allow currents to flow in both of the semiconductor layer 522 and the resistance change layer 523 of the transistor included in the selected memory cell 810. An absolute value of the current-on voltage Vion may be greater than the absolute value of the turn-off voltage Voff and less than the absolute value of the turn-on voltage Von. The value of the current-on voltage Vion may be dependent on types of materials, thicknesses, etc. of the gates 531, the gate insulating layer 521, the semiconductor layer 522, and the resistance change layer 523 that configure the plurality of memory cells MCs. In detail, the current-on voltage Vion may have a value for allowing a resistance distribution of the selected memory cell 810 to have a linear scale.

Also, a read voltage Vread may be applied to a bit line BL connected to the selected memory cell 810 from among a plurality of bit lines BLs. The read voltage Vread may be provided from the outside, for example, the memory controller 100, through the input and output circuit 240. The read voltage Vread may be a voltage for reading data written on the selected memory cell 810. Bit lines BL not connected to the selected memory cell 810 from among the plurality of bit lines BLs may be grounded or floated. Then, a read operation may be performed on the selected memory cell 810.

Figure 10:
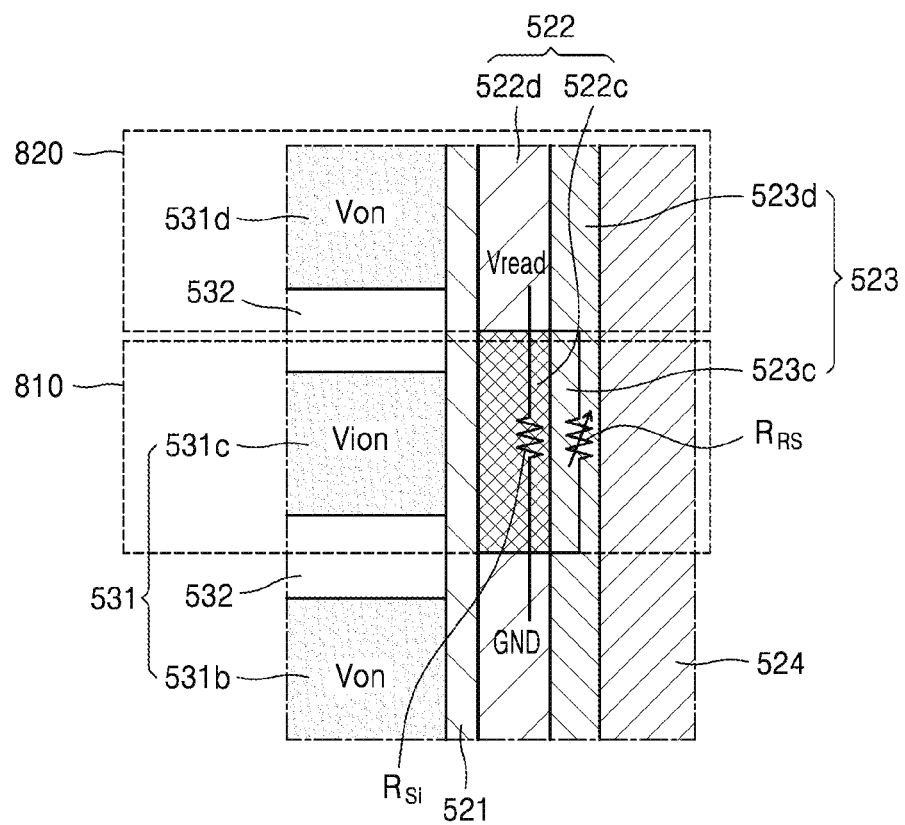
FIG. 10 is a diagram for describing a current movement in a selected memory cell in a read mode, according to an embodiment.

FIG. 10 is a diagram for describing a current movement in the selected memory cell 810 in a read mode, according to an embodiment. Referring to FIG. 10, in the read mode, a read voltage Vread may be applied to the bit line BL connected to the selected memory cell 810, and a turn-on voltage Von may be applied to the non-selected memory cell 820, so that a semiconductor layer 522d of the non-selected memory cell 820 may have a conductive characteristics. Thus, a read current Iread may flow through the semiconductor layer 522d of the non-selected memory cell 820. However, a current-on voltage Vion may be applied to the selected memory cell 810, and thus, the read current Iread may flow through both of a semiconductor layer 522c and a resistance change layer 523c of the selected memory cell 810.

The current-on voltage Vion may have a value to allow a resistance $R_{Si}$ of the semiconductor layer 522c to be in a similar range to a resistance PRS of the resistance change layer 523c. For example, the value of the current-on voltage Vion may be selected such that the resistance $R_{Si}$ of the semiconductor layer 522c corresponding to the selected memory cell 810 is equal to or greater than a minimum resistance of the resistance change layer 523c corresponding to the selected memory cell 810, or the resistance $R_{Si}$ of the semiconductor layer 522c of the selected memory cell 810 is equal to or less than a maximum resistance of the resistance change layer 523c corresponding to the selected memory cell 810.

As a result, the total resistance of the selected memory cell 810 may be determined as a parallel resistance of the resistance $R_{Si}$ of the semiconductor layer 522c and the resistance RRS of the resistance change layer 523c. The read voltage Iread may not flow through a resistance change layer 523d of the non-selected memory cell 820 and may flow only through the semiconductor layer 522d. Thus, the read current Iread may be determined by the total resistance of the selected memory cell 810. Accordingly, the total resistance of the selected memory cell 810 may be calculated by measuring an intensity of the read current Iread.

Figure 11:
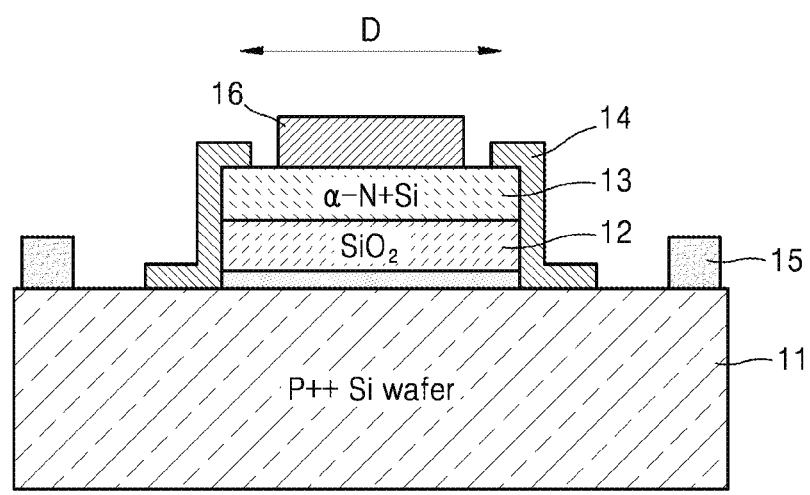
FIG. 11 is a schematic cross-sectional view of a structure for testing an operation of a memory cell, according to an embodiment.

FIG. 11 is a schematic cross-sectional view of a structure for testing an operation of a memory cell, according to an embodiment. Referring to FIG. 11, an $SiO_2$ layer 12 having a thickness of 10 nm may be stacked on a doped p++ Si layer 11, and a doped n+ Si layer 13 having a thickness of 50 nm may be stacked on the SiO₂ layer 12. The SiO₂ layer 12 and the n+ Si layer 13 may be formed by being deposited via a low pressure chemical vapor deposition (LPCVD) method, and then, being thermally processed for 30 seconds at a temperature of 1000° C. via rapid thermal annealing (RTA). Then, the SiO₂ layer 12 and the n+ Si layer 13 may be patterned to have a cylindrical shape having a diameter D of 100 µm via etching.

Thereafter, electrodes 15 and 16 may be formed on the p++ Si layer 11 and the n+ Si layer 13, respectively, through a lift-off process. Pt having a thickness of 20 nm and Ti having a thickness of 20 nm may be used as the electrodes 15 and 16. Thereafter, a transition metal oxide layer 14 may be formed to cover an upper surface of the p++ Si layer 11, a side surface of the SiO₂ layer 12, and an upper surface of n+ Si layer 13. The transition metal oxide layer 14 may be deposited through atomic layer deposition (ALD) at a temperature of 150° C. in an 03 atmosphere to have a thickness of 0.5 nm. TiO₂ may be used as the transition metal oxide layer 14.

In the structure of the memory cell for an experiment, which is illustrated in FIG. 11, the p++ Si layer 11 and the n+ Si layer 13 may be used as semiconductor layers of the turned-on non-selected memory cells 720 and 820, the SiO₂ layer 12 may be used as semiconductor layers of the turned-off selected memory cells 710 and 810, and the transition metal oxide layer 14 may be used as a resistance change layer. Thus, the structure of the memory cell for the experiment, which is illustrated in FIG. 11, shows an example in which the resistance change layer 523 including the metal-semiconductor oxide is formed by thinly depositing the transition metal oxide along the surface of the semiconductor layer 522.

Figure 12:
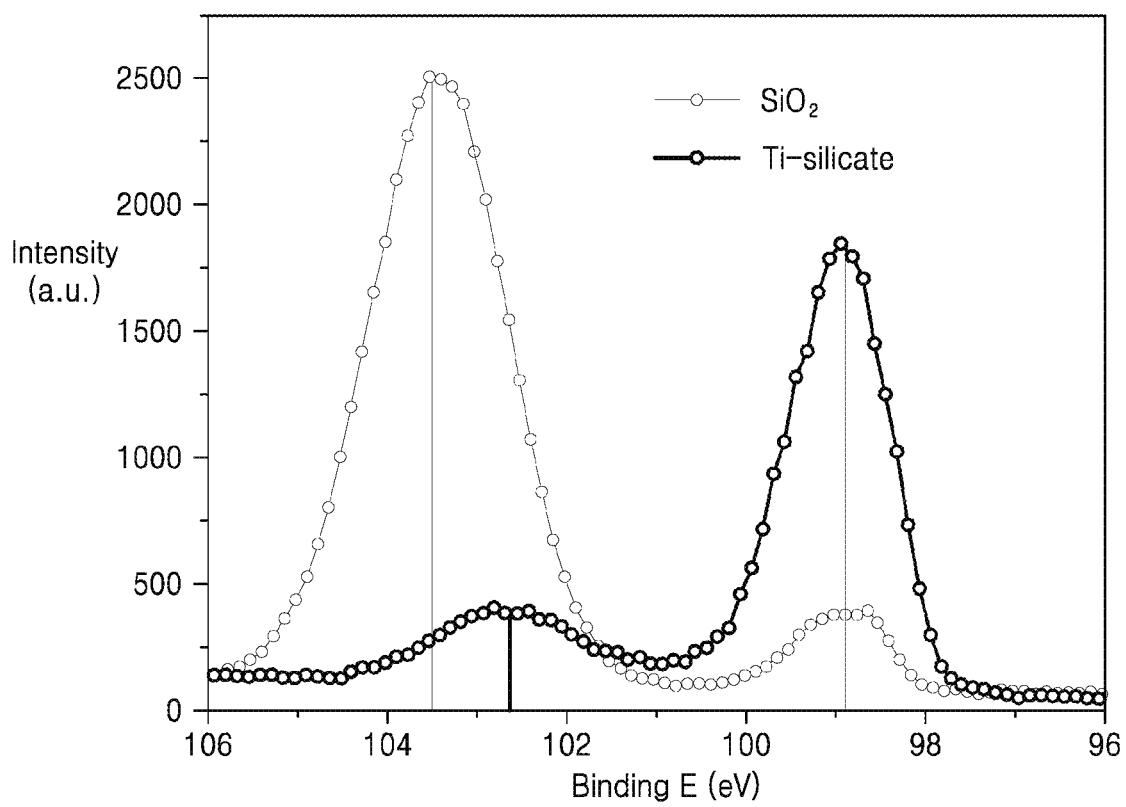
FIG. 12 is a graph of X-ray photoelectron spectroscopy (XPS) data for identifying formation of a metal-semiconductor oxide based on a mixture between a semiconductor material of a semiconductor layer and a transition metal oxide of a resistance change layer in the structure of the memory cell illustrated in FIG. 11.

FIG. 12 is a graph of X-ray photoelectron spectroscopy (XPS) data for identifying formation of a metal-semiconductor oxide by a mixture of a semiconductor material of the semiconductor layer 522 and a transition metal oxide of the resistance change layer 523, in the structure of the memory cell illustrated in FIG. 11. Referring to FIG. 12, a shift of a peak due to a Ti-silicate is shown. Thus, in the memory cell illustrated in FIG. 11, it is understood that Si may be diffused to the transition metal oxide layer 14, which is formed to cover the upper surface of the p++ Si layer 11, the side surface of the SiO₂ layer 12, and the upper surface of the n+ Si layer 13, and thus, the metal-semiconductor oxide may be formed.

Figure 13:
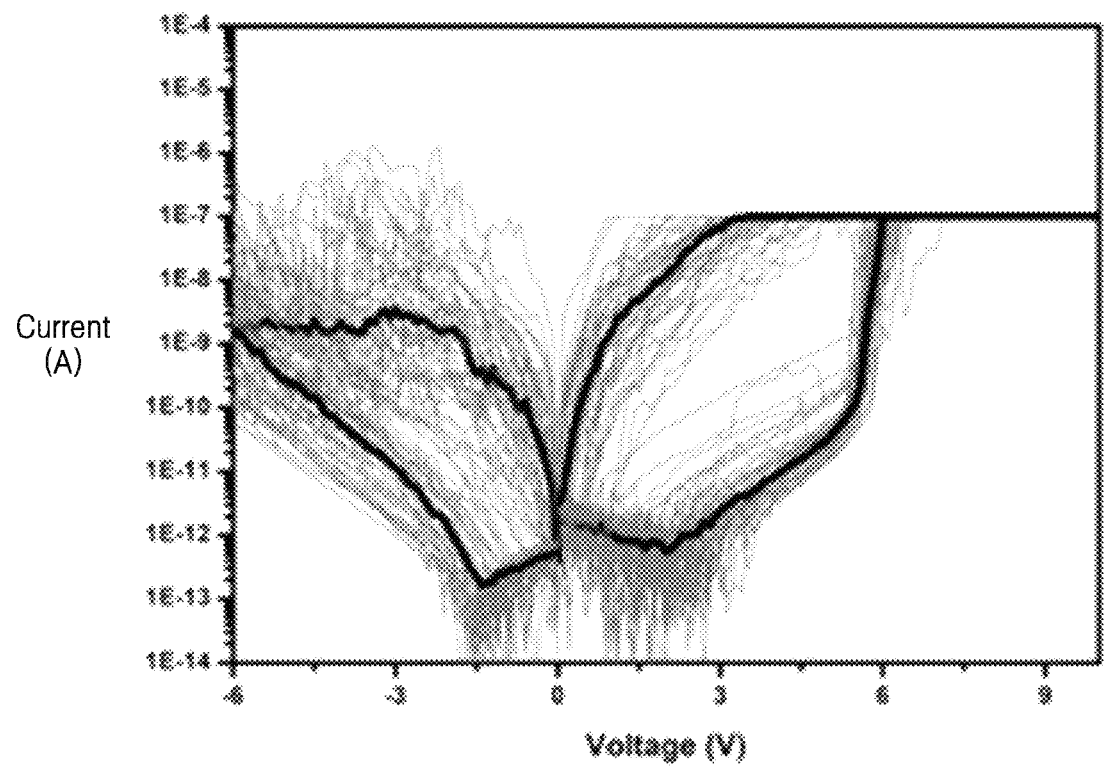
FIG. 13 is a graph of a current-voltage behavior obtained in an experiment with regard to a plurality of memory cell structures including a metal-semiconductor oxide, according to an embodiment.

FIG. 13 is a graph of a current-voltage behavior obtained by experiments with regard to a plurality of memory cells including the metal-semiconductor oxide, according to an embodiment. In detail, FIG. 13 shows results of experiments with respect to 64 memory cells, which are manufactured to have the structure illustrated in FIG. 11. In order to identify the possibility of a multi-level during the experiments, a compliance current of 100 nA may be applied to the memory cells. A graph indicated by using a thick solid line in FIG. 13 shows an average current-voltage behavior with respect to the 64 memory cells. As illustrated in FIG. 13, it is shown that a resistance change occurs in all of the memory cells and a plurality of resistance states are clearly divided.

Figure 14:
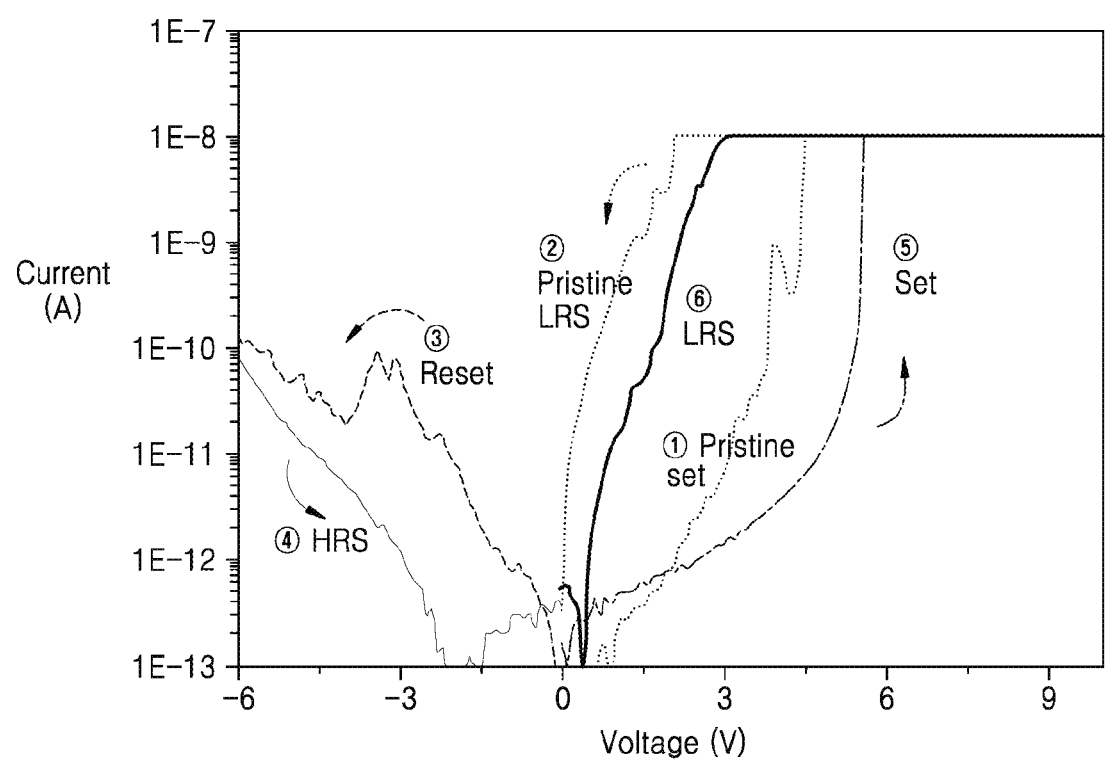
FIG. 14 is a graph of the current-voltage behavior of the memory cell including the metal-semiconductor oxide, the current-voltage behavior being identified through the graph of FIG. 13.

FIG. 14 is a graph of the current-voltage behavior of the memory cells including the metal-semiconductor oxide, identified through the graph of FIG. 13. Referring to FIG. 14, a voltage required for a pristine set operation is lower than a voltage required for a subsequent set operation, and thus, an electrical forming process may not be required. The voltage that is applied during the set operation may be limited to have a relatively low value less than or equal to about 10 V. Particularly, the voltage that is applied during the set operation may be in a range of about 5 V to about 8 V. Also, a voltage during a reset operation may also be limited to have a relatively low value of about −6 V.

Thus, in the program mode illustrated in FIGS. 7A and 8, when a program voltage Vprogram less than or equal to about 10 V, for example, of about 5 V to about 8 V, is applied to the bit line BL connected to the selected memory cell 710, an electron may be trapped in a charge trap in the resistance change layer 523a corresponding to the selected memory cell 710, among the plurality of resistance change layers 523, and thus, a resistance of the resistance change layer 523a corresponding to the selected memory cell 710 may be decreased. Also, when a program voltage Vprogram of about −6 V is applied to the bit line BL connected to the selected memory cell 710, the electron may be de-trapped from the charge trap in the resistance change layer 523a corresponding to the selected memory cell 710, and thus, the resistance of the resistance change layer 523a corresponding to the selected memory cell 710 may be increased.

Because the forming process is not required, there is almost no possibility of damage to the memory block due to a high forming voltage. Also, the set voltage and the reset voltage may be maintained to be relatively low voltages, and thus, power consumption of the memory device 200 may be reduced.

Figure 15:
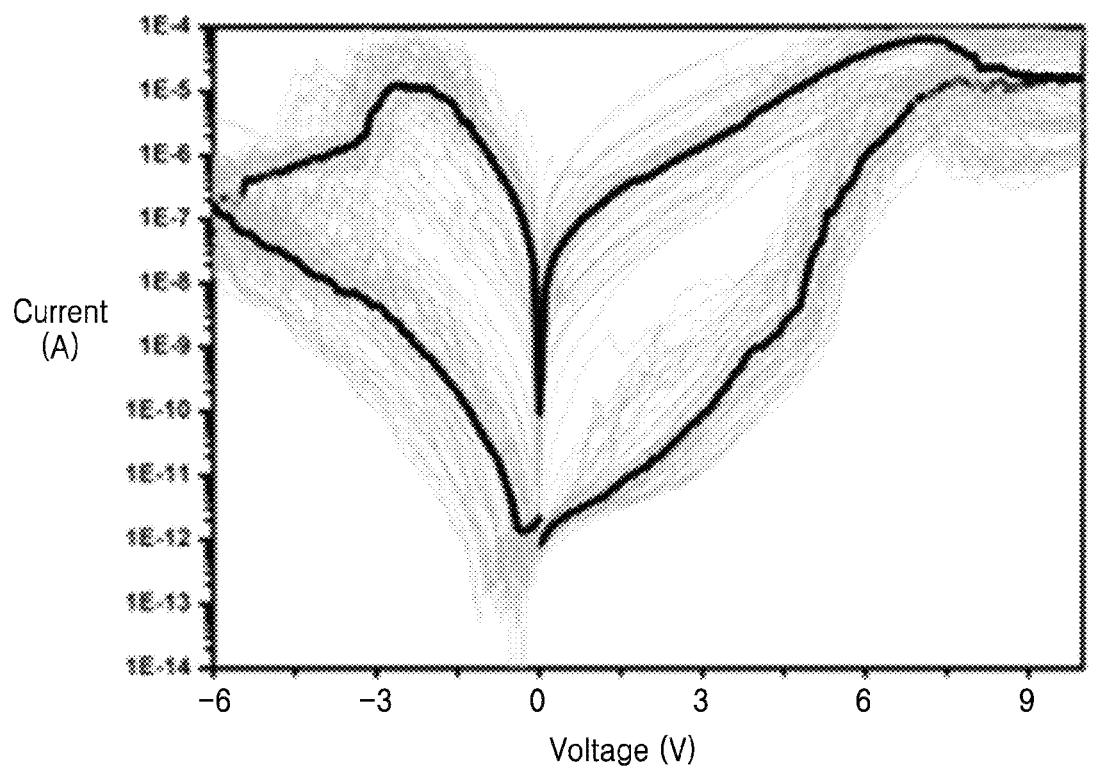
FIGS. 15 and 16 are graphs of a current-voltage behavior of a memory cell including a metal-semiconductor oxide, according to comparative embodiments.
Figure 16:
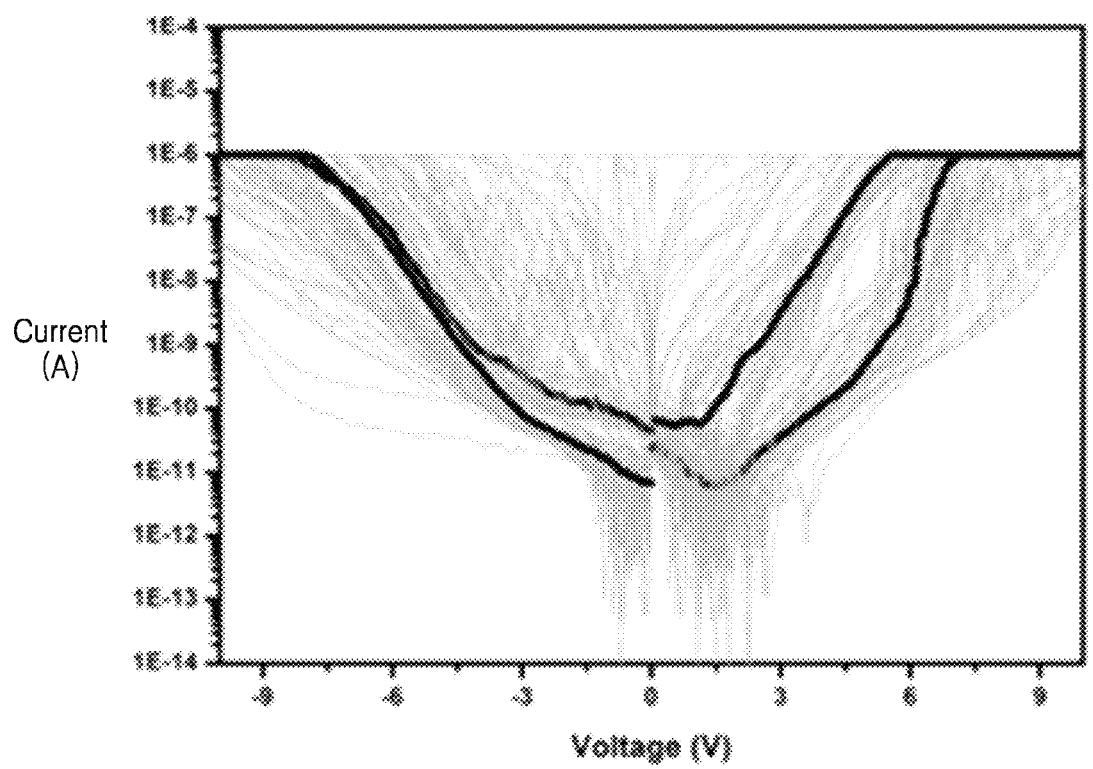

FIGS. 15 and 16 are graphs of a current-voltage behavior of a memory cell including a metal-semiconductor oxide, according to comparative embodiments. FIG. 15 shows experimental results with respect to 64 memory cells, in which HfO₂, rather than TiO₂, is used as the transition metal oxide layer 14 based on the structure of the memory cells illustrated in FIG. 11, and FIG. 16 shows experimental results with respect to 64 memory cells, in which Al₂O₃ is used. When HfO₂ is used, a compliance current of 0.1 A may be applied to the memory cells, and when Al₂O₃ is used, a compliance current of 1 µA may be applied to the memory cells. As illustrated in FIGS. 15 and 16, when HfO₂ and Al₂O₃ are used, sufficient charge traps may not be formed in a Hf-silicate and an Al-silicate, and thus, a plurality of resistance states may not be clearly divided.

FIG. 17 is a comparison table between the characteristics of a memory cell including a metal-semiconductor oxide, according to an embodiment, and a memory cell including a metal-semiconductor oxide, according to a comparative embodiment. In the table of FIG. 17, an yield rate is a probability in which the resistance of a high resistance state (HRS) and the resistance of a low resistance state (LRS) have a 1000 times or more difference. In other words, the yield rate is a rate of the memory cells having an on/off current ratio of 1000 or greater to the total memory cells when a read voltage of 4 V is applied to the memory cells. Referring to FIG. 17, when Al₂O₃ is used as the transition metal oxide layer 14, the ratio of the memory cells having the on/off current ratio of 1000 or greater is merely about 14.06%. When HfO₂ is used, the ratio of the memory cells having the on/off current ratio of 1000 or greater is about 90.16%, and when TiO₂ is used, the ratio of the memory cells having the on/off current ratio of 1000 or greater is the highest as about 93.88%.

Also, the non-uniformity in the table of FIG. 17 is a value obtained by dividing a difference between a maximum resistance Rmax and a minimum resistance Rmin of the memory cells that are measured with respect to an identical resistance state, by an average resistance Raver, and may be represented as 100*(Rmax−Rmin)/(2*Raver). The non-uniformity with respect to 64 memory cells is highest as about 29.2 when $Al_2O_3$ is used as the transition metal oxide layer 14 and is lowest as about 8.7 when $TiO_2$ is used as the transition metal oxide layer 14.

Figure 18:
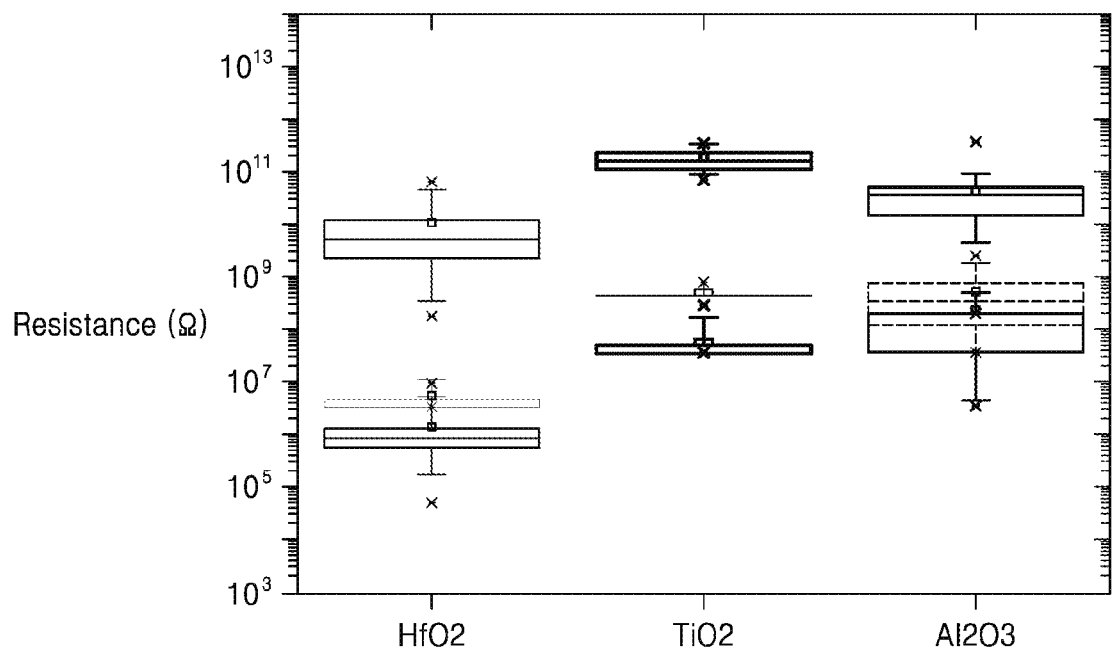
FIG. 18 is a comparison graph between the resistance distributions of a memory cell including a metal-semiconductor oxide according to an embodiment and a memory cell including a metal-semiconductor oxide according to a comparative embodiment.

FIG. 18 is a comparison graph between the resistance distributions of a memory cell including a metal-semiconductor oxide according to an embodiment and a memory cell including a metal-semiconductor oxide according to a comparative embodiment. When $HfO_2$ is used as the transition metal oxide layer 14, the resistance distribution is obtained by applying compliance currents of 0.1 A and 1 µA to each of 64 memory cells. When $TiO_2$ is used as the transition metal oxide layer 14, the resistance distribution is obtained by applying compliance currents of 100 nA and 10 nA to each of the 64 memory cells. Also, when $Al_2O_3$ is used as the transition metal oxide layer 14, the resistance distribution is obtained by applying compliance currents of 1 µA and 100 nA to each of the 64 memory cells. A read voltage applied to the memory cells is 4 V. As shown in the graph of FIG. 18, the resistance distribution is the smallest when $TiO_2$ is used. Also, when $TiO_2$ is used, overlapping between a plurality of resistance states is the lowest. Thus, when $TiO_2$ is used, by adjusting the compliance currents flowing through the memory cells, an MLC having at least three different resistance states may be realized.

Figure 19A:
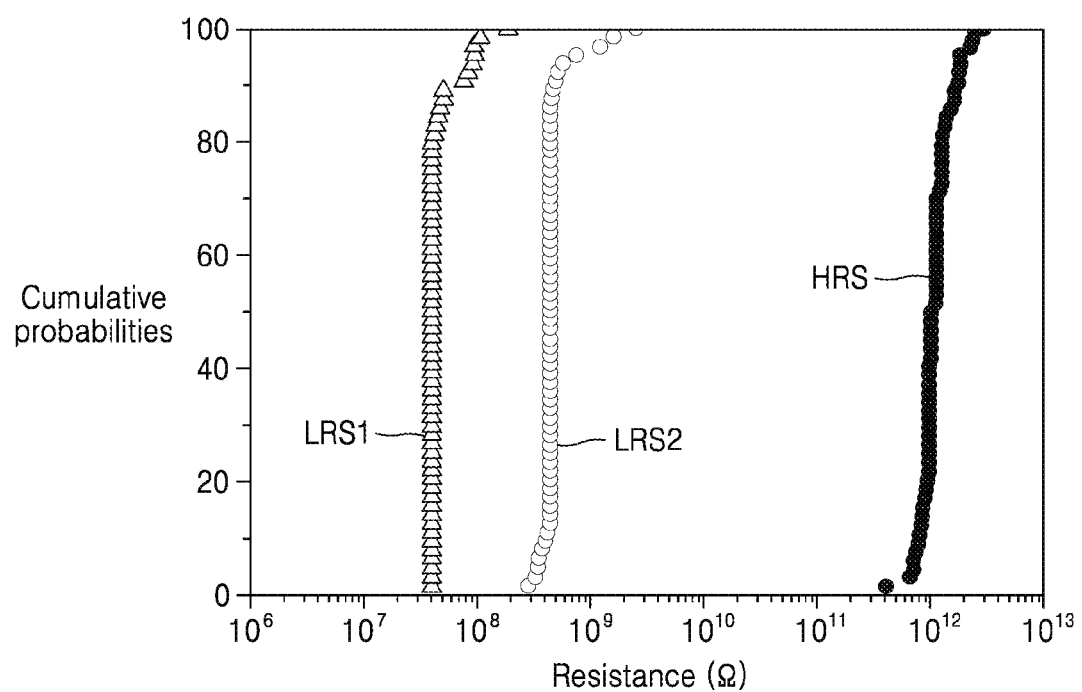
FIGS. 19A and 19B are graphs of cumulative probabilities with respect to resistance distributions of a memory cell including a metal-semiconductor oxide according to an embodiment and a memory cell including a metal-semiconductor oxide according to a comparative embodiment, respectively.
Figure 19B:
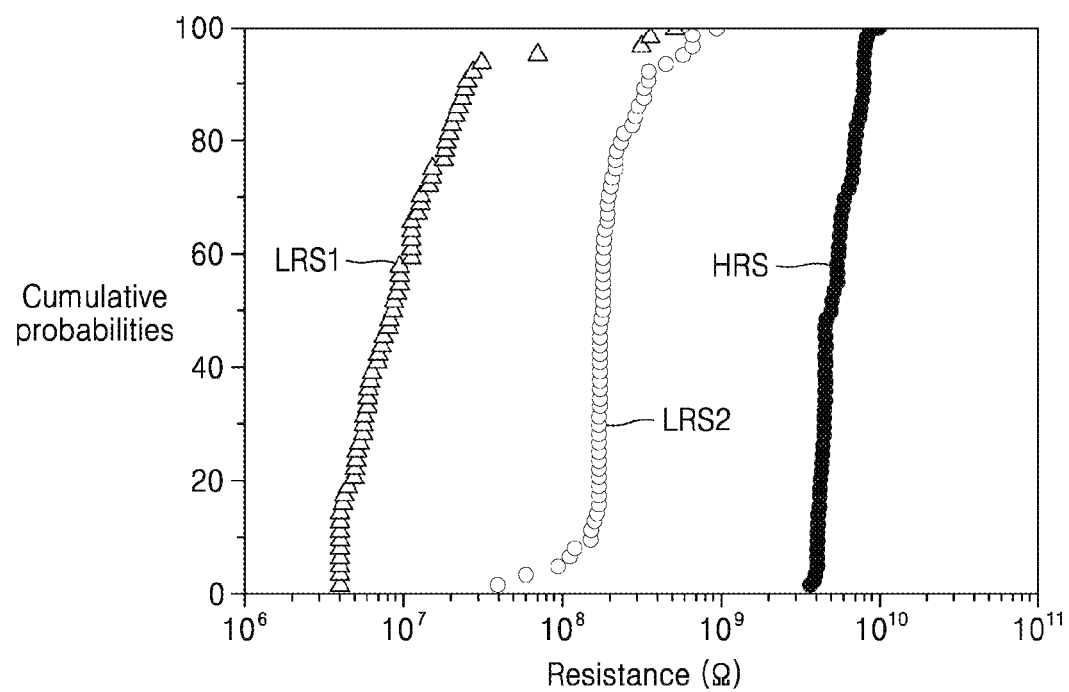

FIGS. 19A and 19B are respectively graphs of cumulative probabilities with respect to resistance distributions of a memory cell including a metal-semiconductor oxide according to an embodiment and a memory cell including a metal-semiconductor oxide according to a comparative embodiment. Experiments conditions are the same as described in FIG. 18. FIGS. 19A and 19B indicate the results obtained in FIG. 18 by changing the results into the cumulative probabilities. FIG. 19A shows the cumulative probability when $TiO_2$ is used as the transition metal oxide layer 14, and FIG. 19B shows the cumulative probability when $HfO_2$ is used as the transition metal oxide layer 14. When $TiO_2$ is used, gradients of cumulative probabilities of all of three resistance states, that is, LRS1, LRS2, and HRS, are steep, and overlapping among LRS1, LRS2, and HRS is small, and thus, LRS1, LRS2, and HRS are clearly divided. However, when $HfO_2$ is used, overlapping exists between the two low resistance states, that is, LRS1 and LRS2, and thus, the resistance states are not clearly divided.

As shown from the experimental results above, when $TiO_2$ is used as the transition metal oxide layer 14, that is, when a Ti-silicate is used as the resistance change layer 523, a high uniformity may be obtained with respect to the resistance distribution of the resistance change layer 523. Also, overlapping among the resistance states of the resistance change layer 523 is low, and thus, the resistance states may be clearly divided. Thus, the resistance change layer 523 including the Ti-silicate is efficient for realizing the MLC.

Figure 20A:
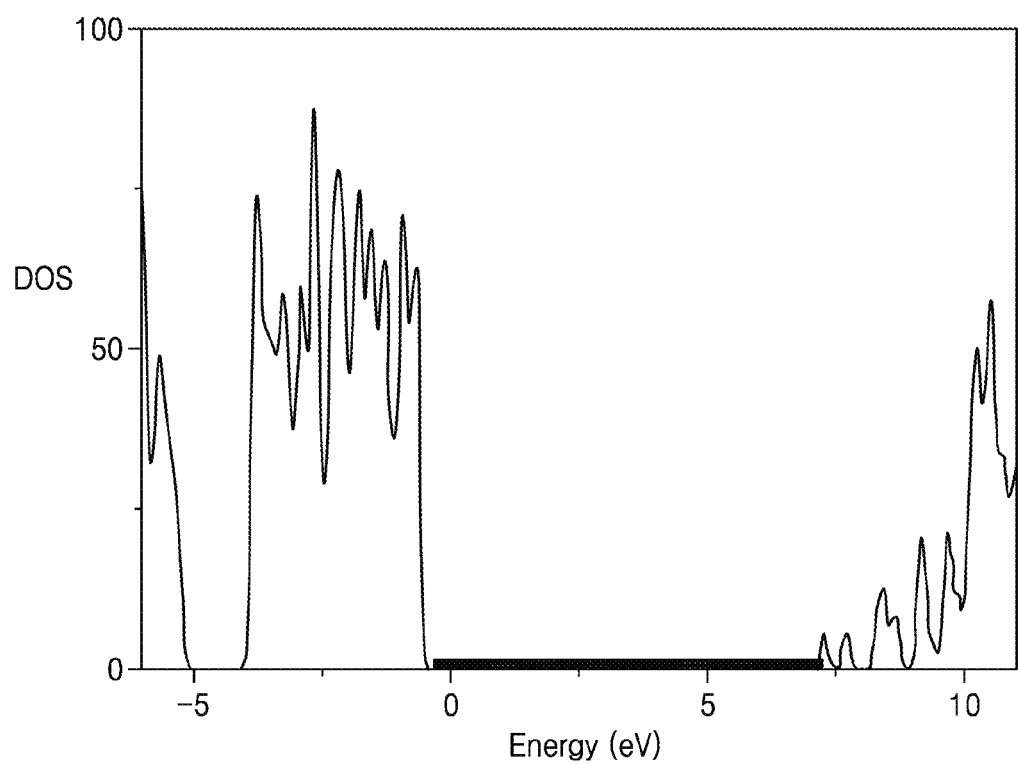
FIGS. 20A through 20C are partial density of states (PDOS) diagrams of a comparison between characteristics of a metal-semiconductor oxide according to an embodiment, and a metal-semiconductor oxide according to a comparative embodiment.
Figure 20B:
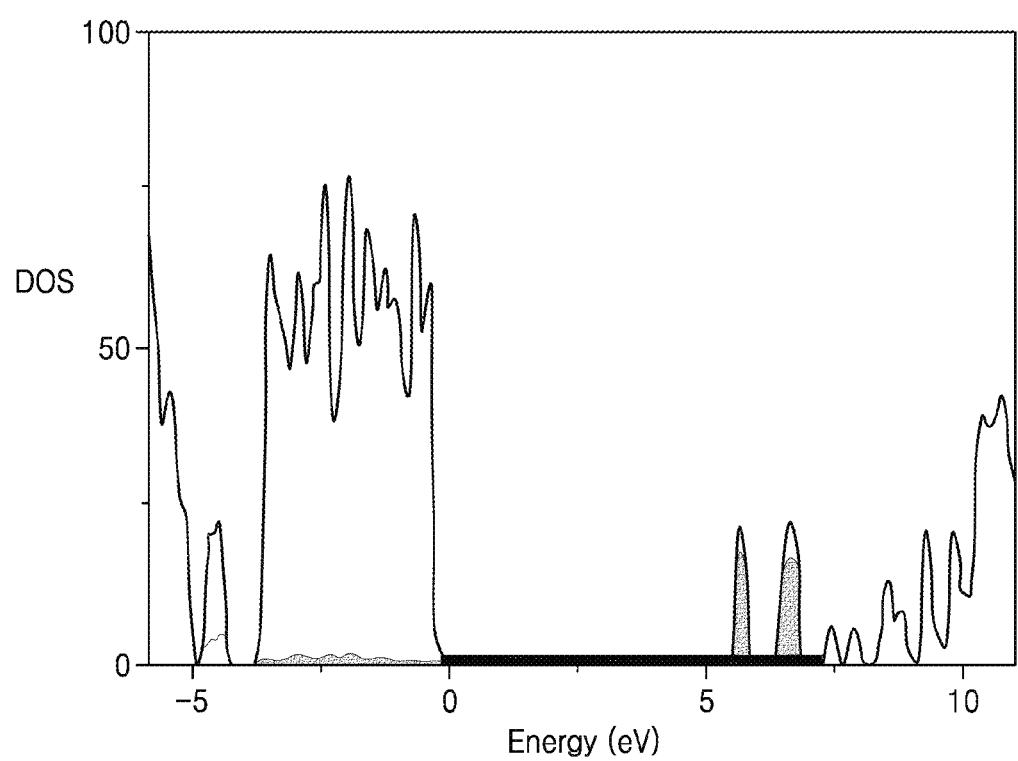
Figure 20C:
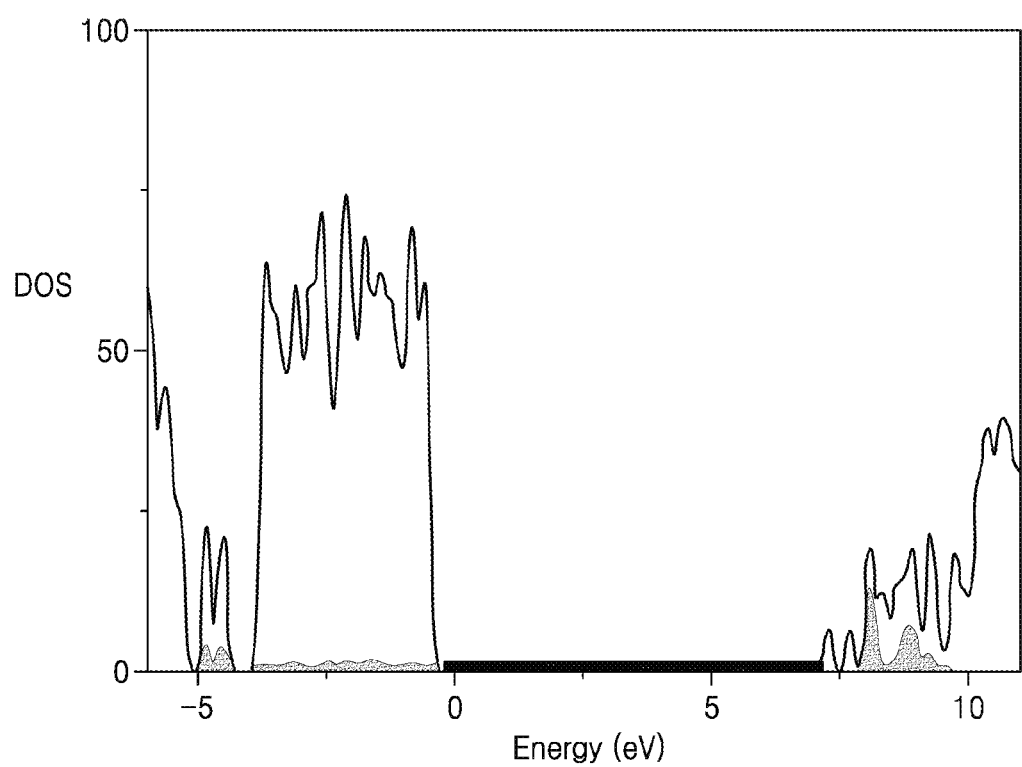

FIGS. 20A through 20C are diagrams of partial density of states (PDOS) showing a comparison between characteristics of a metal-semiconductor oxide, according to an embodiment, and a metal-semiconductor oxide, according to a comparative embodiment. In detail, FIG. 20A is the diagram of the PDOS of $SiO_2$, FIG. 20B is the diagram of the PDOS when some Si atoms in a $SiO_2$ site are substituted by Ti atoms, and FIG. 20C is the diagram of the PDOS when some Si atoms in the $SiO_2$ site are substituted by Hf atoms. Thick solid lines in FIGS. 20A through 20C indicate a band gap of $SiO_2$. Also, parts indicated by thin solid line in FIG. 20B is the PDOS of a Ti-silicate, and parts indicated by thin solid line in FIG. 20C is the PDOS of a Hf-silicate.

As illustrated in FIG. 20B, in the case of the Ti-silicate, a charge trap site formed due to an anti-site defect may exist in the band gap of $SiO_2$. That is, in the case of the Ti-silicate, a defect state may be directly formed in the band gap of $SiO_2$ so that a new trap site may be formed in the band gap of $SiO_2$. In contrast, as illustrated in FIG. 20C, in the case of the Hf-silicate, a defect state may be formed in a valence band region or a conduction band region of $SiO_2$. Thus, the Hf-silicate may not form a new trap site in the band gap of $SiO_2$.

Based on this reason, the transition metal oxide material which is capable of easily forming the metal-semiconductor oxide by being mixed with the semiconductor material, and capable of forming the charge trap site in the band gap of an oxide of the semiconductor material due to the anti-site defect with respect to the semiconductor material may be appropriate for forming the metal-semiconductor oxide of the resistance change layer 523. Thus, the transition metal oxide, which is appropriate for forming the metal-semiconductor oxide of the resistance change layer 523, may have a band gap that is much smaller than the band gap of the semiconductor oxide. For example, the band gap of the transition metal oxide may be less than 4.5 eV. Particularly, the band gap of the transition metal oxide may be less than 3.5 eV.

Figure 21:
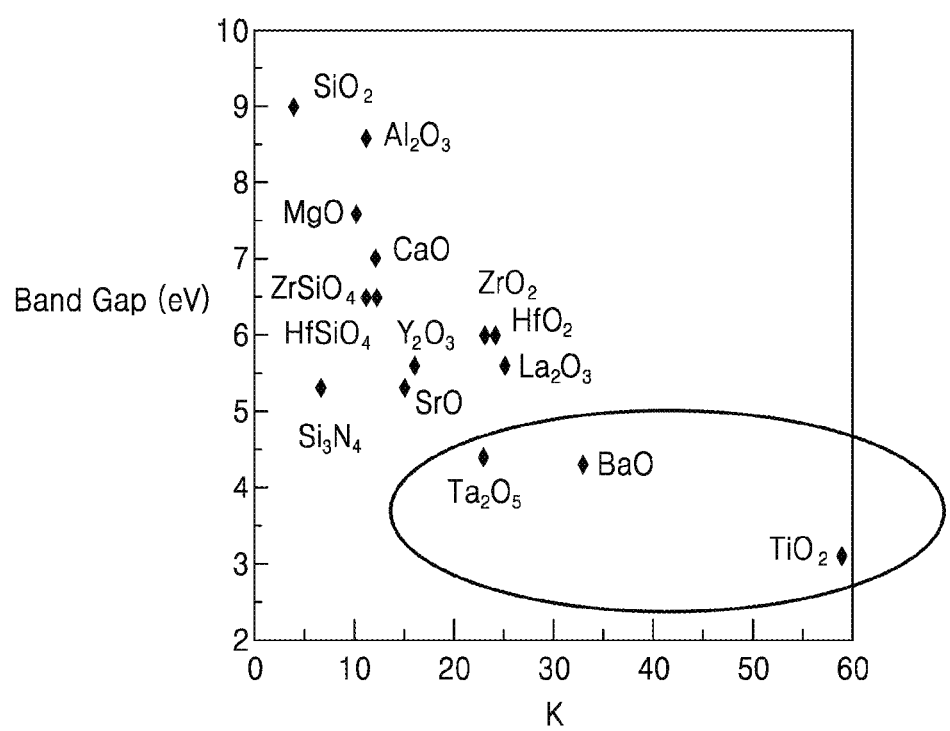
FIG. 21 is a graph of a band gap distribution of candidate transition metal oxides for generating a metal-semiconductor oxide of a resistance change layer according to an embodiment.

For example, FIG. 21 is a graph of band gap distributions of candidate transition metal oxides for generating the metal-semiconductor oxide of the resistance change layer 523. As indicated by a circle in FIG. 21, when Si is used as the semiconductor material of the semiconductor layer 522, the transition metal oxide, such as $Ta_2O_5$, BaO, $TiO_2$, or the like, which has a less band gap and is reported to form a silicate, may be used. In this case, the metal-semiconductor oxide of the resistance change layer 523 may include, for example, a Ta-silicate, a Ba-silicate, a Ti-silicate, etc.

Meanwhile, in oxides having a small conduction band offset (CBO) with n+ Si, due to small band gaps, the resistance change may not be generally observed. According to the embodiment of the disclosure, even when the band gap of the transition metal oxide used to form the resistance change layer 523 is small, because most portions of the resistance change layer 523 may include the metal-semiconductor oxide by reducing the thickness of the resistance change layer 523, the resistance change may be observed. Accordingly, when the thickness of the resistance change layer 523 is increased, a ratio of the transition metal oxide remaining in the resistance change layer 523 may be increased, and thus, the performance of the resistance change layer 523 may deteriorate due to bulk conduction.

Figure 22:
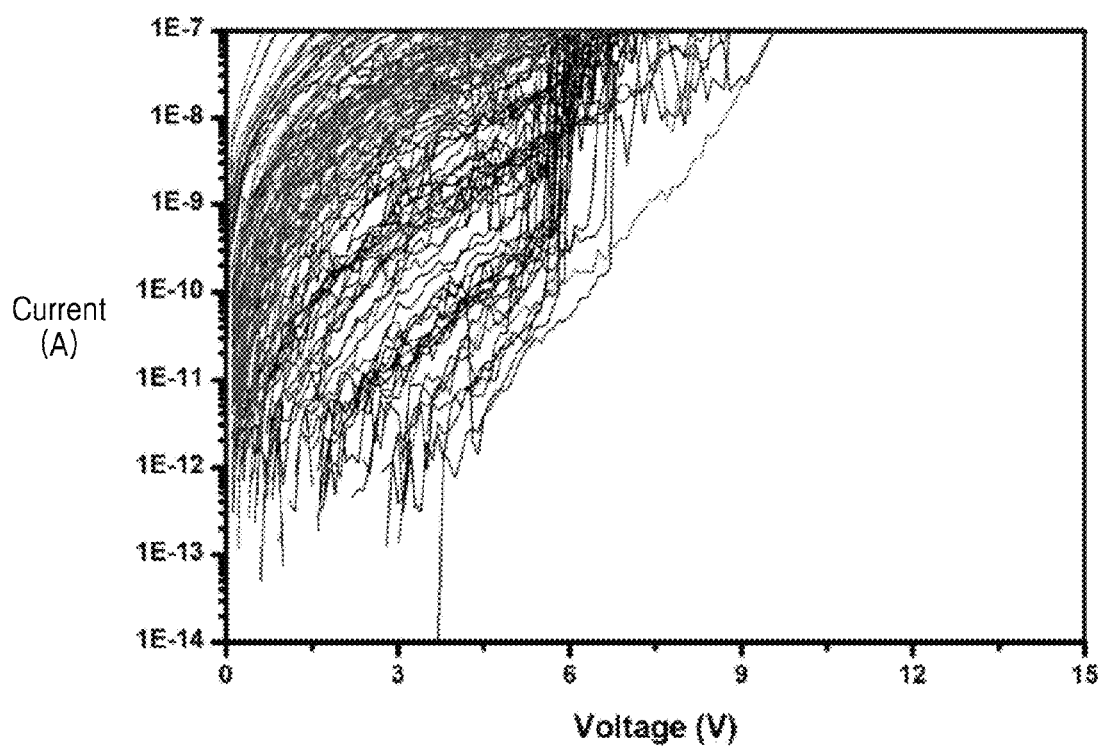
FIG. 22 is a graph of a current-voltage behavior when a thickness of a transition metal oxide is increased in the structure of the memory cell illustrated in FIG. 11.

For example, FIG. 22 is a graph of a current-voltage behavior when the thickness of the transition metal oxide is increased, in the structure of the memory cells illustrated in FIG. 11. In detail, FIG. 22 shows a result of an experiment performed on a case in which the transition metal oxide layer 14 including $TiO_2$ is deposited to have a thickness of 3 nm, in the structure of the memory cells illustrated in FIG. 11. As shown in FIG. 22, when the thickness of the transition metal oxide layer 14 is increased, bulk conduction intrinsically included in $TiO_2$ may appear.

Also, FIG. 23 is a table showing changes of characteristics of the memory cells illustrated in FIG. 11 according to gradual thickness changes of the transition metal oxide. Each of the memory cells illustrated in FIG. 11, the memory cells having only different thicknesses of the transition metal oxide layer 14, is formed, and current-voltage behaviors of the memory cells are measured by applying a compliance current of 100 nA to the memory cells. As illustrated in FIG.

23, a ratio of the memory cells having an on/off current ratio of 10 or higher may be 96.8% when the transition metal oxide layer 14 is deposited to have a thickness of 0.5 nm. Also, as the thickness of the transition metal oxide layer 14 is increased and/or decreased, the ratio of the memory cell having the on/off ratio of 10 or higher may decrease. When the transition metal oxide layer 14 is deposited to have a thickness of 1.5 nm, a resistance change phenomenon rarely occurs.

A deposition limit of a thickness of the transition metal oxide layer 14 may vary with an intensity of the compliance current applied to the memory cells or sizes or structures of the memory cells. Accordingly, a maximum thickness of the resistance change layer 523 in the actual memory device 200 may be about 2.0 nm. For example, the thickness of the resistance change layer 523 may be in the range between about 0.1 nm and about 2.0 nm. Or, the thickness of the resistance change layer 523 may be in the range between about 0.3 nm and about 1.5 nm. Or, the thickness of the resistance change layer 523 may be in the range between about 0.5 nm and about 1.0 nm.

When the resistance change layer 523 is formed by directly depositing a prepared metal-semiconductor oxide along a surface of the semiconductor layer 522, a first semiconductor material of the semiconductor layer 522 and a second semiconductor material of the metal-semiconductor oxide may be different from each other. In this case, the anti-site defect in the metal-semiconductor oxide may occur due to inversion of a site between the second semiconductor material and the transition metal. Thus, a transition metal oxide material, which may form the charge trap site due to the anti-site defect in the band gap of an oxide of the second semiconductor material included in the metal-semiconductor oxide, may be appropriate for forming the metal-semiconductor oxide of the resistance change layer 523. Also, the transition metal oxide which is appropriate for forming the metal-semiconductor oxide of the resistance change layer 523 may have a band gap that is much smaller than a band gap of the oxide of the second semiconductor material.

When a portion of the first semiconductor material of the semiconductor layer 522 is diffused into the resistance change layer 523, the metal-semiconductor oxide may include both of the first semiconductor material and the second semiconductor material. In this case, both of the transition metal oxide material capable of forming the charge trap site due to the anti-site defect in the band gap of the oxide of the first semiconductor material, and the transition metal oxide material capable of forming the charge trap site due to the anti-site defect in the band gap of the oxide of the second semiconductor material, may be used. Also, the transition metal oxide for forming the resistance change layer 523 may have a band gap that is smaller than the band gap of the oxide of the first semiconductor material and may have a band gap that is smaller than the band gap of the oxide of the second semiconductor material.

Also, when the resistance change layer 523 is formed by directly depositing the prepared metal-semiconductor oxide along the surface of the semiconductor layer 522, the metal-semiconductor oxide may be uniformly distributed throughout the entire areas of the resistance change layer 523. Thus, in this case, it is possible to form the resistance change layer 523 having a greater thickness than the examples described above.

Figure 24:
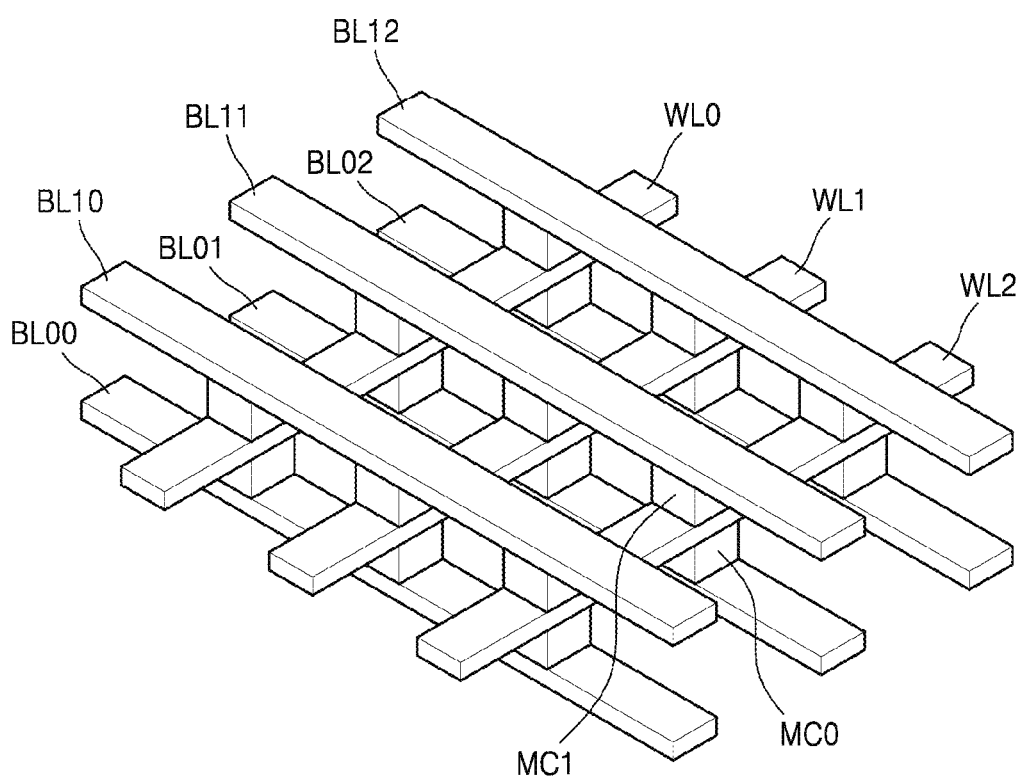
FIG. 24 is a schematic diagram of a structure of a memory device according to a comparative embodiment.
Figure 25:
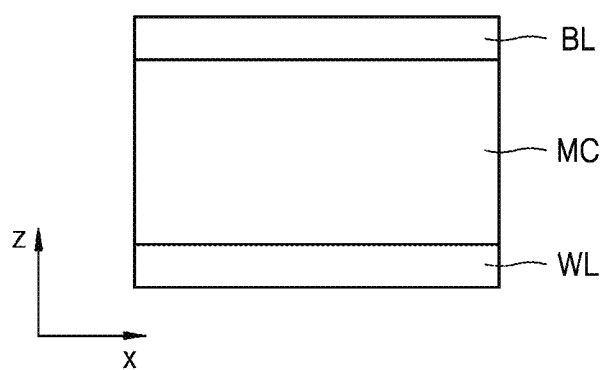
FIG. 25 is a schematic cross-sectional view of a structure of one memory cell of the memory device illustrated in FIG. 24 according to the comparative embodiment.

FIG. 24 is a schematic diagram of a structure of a memory device according to a comparative embodiment. The memory device, according to the comparative embodiment, may correspond to a resistive random-access memory (RRAM) and may have a structure in which memory cells MC0 and MC1 are arranged at each of points at which a plurality of bit lines BL00, BL01, BL02, BL10, BL11, and BL12 and a plurality of word lines WL0, WL1, and WL2 perpendicularly intersect with each other. Also, FIG. 25 is a schematic cross-sectional view of a structure of one memory cell of the memory device illustrated in FIG. 24. Referring to FIG. 25, a bit line BL and a word line WL may be connected to an upper portion and a lower portion of each memory cell MC.

The RRAM may be similar to the memory device 200 according to the disclosure in that the RRAM includes a memory cell MC including a resistance change material, but may have different structures and operating principles from the memory device 200 according to the disclosure. In the case of the RRAM, according to the comparative embodiment, a resistance change of the memory cell MC may not correspond to a resistance change of the resistance change material. Rather, the resistance change in the RRAM may occur due to an ion movement in an electrode, that is, the bit line BL and the word line WL. In particular, because an interfacial direction (an x-direction) of the resistance change material is perpendicular to a direction of an electric field (a z-direction), the resistance change may not be concentrated in the interface of the resistance change material.

Figure 26A:
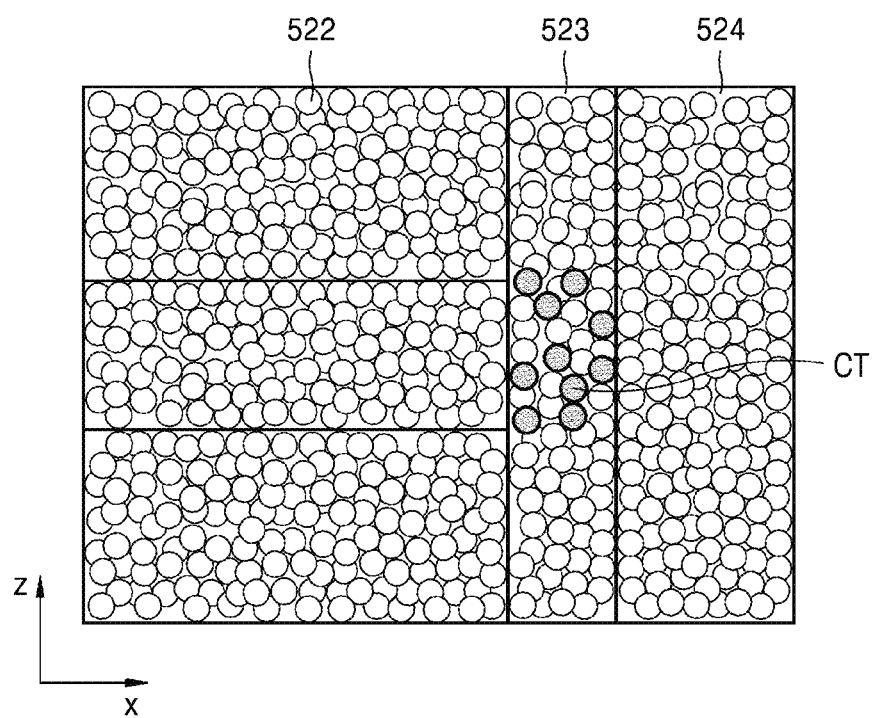
FIGS. 26A and 26B are conceptual diagrams of an example of a principle of a resistance change operation in a resistance change layer of a memory cell, according to an embodiment.
Figure 26B:
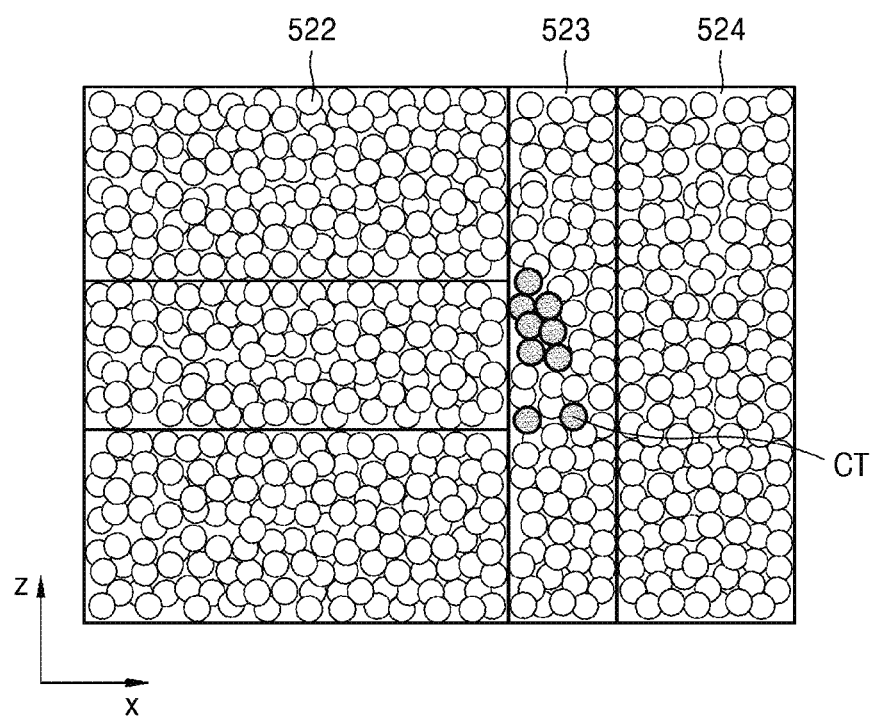

FIGS. 26A and 26B are example conceptual diagrams of a principle of a resistance changing operation in a resistance change layer of a memory cell, according to an embodiment. As illustrated in FIG. 26A, in a case in which a plurality of charge traps CT are evenly distributed in the resistance change layer 523, the resistance change layer 523 may be changed into a high resistance state. The charge traps CT may include a charge trap formed due to an anti-site defect and a charge trap formed due to oxygen vacancies. On the contrary, as illustrated in FIG. 26B, in a case in which the plurality of charge traps CT in the resistance change layer 523 move toward an interface between the resistance change layer 523 and the semiconductor layer 522, to be distributed mainly on the interface between the resistance change layer 523 and the semiconductor layer 522, the resistance change layer 523 may be changed into a low resistance state.

These resistance changes of the resistance change layer 523 may be described as a phenomenon in which an electron is trapped/de-trapped in/from the charge trap CT. When the charge traps CT are evenly distributed in the resistance change layer 523, the charge traps CT may be apart from each other by a certain distance, and the electron may be de-trapped from the charge trap CT, and thus, it is difficult for currents to flow through the resistance change layer 523. Thus, the resistance change layer 523 may be changed into the high resistance state. On the contrary, when the charge traps CT in the resistance change layer 523 are mainly distributed on the interface between the resistance change layer 523 and the semiconductor layer 522, the electron may be filled in the interface between the resistance change layer 523 and the semiconductor layer 522, on which the charge traps CT are mainly distributed, and thus, a conductive filament may be formed. Thus, the resistance change layer 523 may be changed into the low resistance state.

Thus, when moving the charge traps CT distributed in the resistance change layer 523 to the interface between the resistance change layer 523 and the semiconductor layer 522 through a program operation and trapping the electron in the charge traps CT, the resistance change layer 523 may be changed into the low resistance state. On the contrary, when evenly scattering the charge traps CT in the resistance change layer 523, by moving the charge traps CT concentrated on the interface between the resistance change layer 523 and the semiconductor layer 522 away from the interface between the resistance change layer 523 and the semiconductor layer 522 through an erase operation and de-trapping the electron from the charge traps CT, the resistance change layer 523 may be again changed into the high resistance state. For example, in the program mode illustrated in FIGS. 7A (and/or 7C) and 8, when a positive (+) program voltage Vprogram is applied to the selected memory cell 710 through the bit line BL connected to the selected memory cell 710, the resistance change layer 523a corresponding to the selected memory cell 710 may have a decreased resistance. Also, when a negative (−) program voltage is applied to the selected memory cell 710 through the bit line BL, the resistance change layer 523a corresponding to the selected memory cell 710 may have an increased resistance.

To this end, in the program mode illustrated in FIGS. 7A (and/or 7C) and 8, the positive (+) program voltage may be applied through the bit line BL connected to the selected memory cell 710 in the memory cell string. Here, the charge traps CT may move toward the interface between the semiconductor layer 522 and the resistance change layer 523a corresponding to the selected memory cell 710, and the electron may be trapped in the charge traps CT, in the resistance change layer 523a corresponding to the selected memory cell 710. Then, when a density of the charge traps CT is increased on the interface between the semiconductor layer 522 and the resistance change layer 523a, the resistance change layer 523a corresponding to the selected memory cell 710 may have a decreased resistance.

Also, a negative (−) program voltage may be applied to the selected memory cell 710 in the memory cell string through the bit line BL. In this case, the charge traps CT in a partial region of the resistance change layer 523a corresponding to the selected memory cell 710 may move away from the interface between the semiconductor layer 522 and the resistance change layer 523a, the electron may be de-trapped from the charge traps CT, and the density of the charge traps CT on the interface between the semiconductor layer 522 and the resistance change layer 523a may be decreased. Then, the resistance change layer 523a corresponding to the selected memory cell 710 may have an increased resistance.

As described with reference to FIG. 14, the positive (+) program voltage applied during the set operation may be limited to have a relatively low value of a value less than or equal to about 10 V. Particularly, the positive (+) program voltage may be selected in a range between about 5 V and about 8 V. Also, a negative (−) program voltage applied during the reset operation may also be limited to have a relatively low value of about −6 V.

Like this, unlike the RRAM according to the comparative embodiment, in the memory device 200 according to an example embodiment, the charge traps CT may be concentrated on the interface between the semiconductor layer 522 and the resistance change layer 523, and thus, the resistance change may also be concentrated on the interface between the semiconductor layer 522 and the resistance change layer 523. Thus, the uniformity with respect to the plurality of memory cells may be improved. This may be possible, because the direction (the z-direction) of the interface between the semiconductor layer 522 and the resistance change layer 523 is the same as the direction (the z-direction) of the electric field applied to the resistance change layer 523. In other words, a direction of the current flowing through the resistance change layer 523 may be the same as the direction in which the resistance change layer 523 extends.

In the RRAM according to the comparative embodiment, the direction of the electric field applied to the resistance change material may be perpendicular to the direction of the interface with respect to the resistance change material, and thus, an electrical forming process for activating the ion movement may be required right after the RRAM is manufactured. The memory device 200 according to the embodiment may not require this electrical forming process.

Also, as described above, the MLC having at least three different resistance states may be realized by adjusting the compliance current flowing through the resistance change layer 523. For example, in the program mode illustrated in FIGS. 7A (and/or 7C) and 8, a channel resistance of the non-selected memory cell 720, in other words, the resistance of the semiconductor layer 522b of the non-selected memory cell 720, may be changed, according to an intensity of a turn-on voltage applied to the gate 531b of the non-selected memory cell 720. Thus, when the program voltage applied to the bit line BL connected to the selected memory cell 710 is fixed, the current flowing through the resistance change layer 523a of the selected memory cell 710 may be changed according to the intensity of the turn-on voltage applied to the gate 531b of the non-selected memory cell 720. By adjusting the turn-on voltage applied to the gate 531b of the non-selected memory cell 720 based on this method, the condition of the current flowing through the resistance change layer 523a may be selected, so that the resistance change characteristics and the resistance states of the resistance change layer 523a may be selected.

Figure 27:
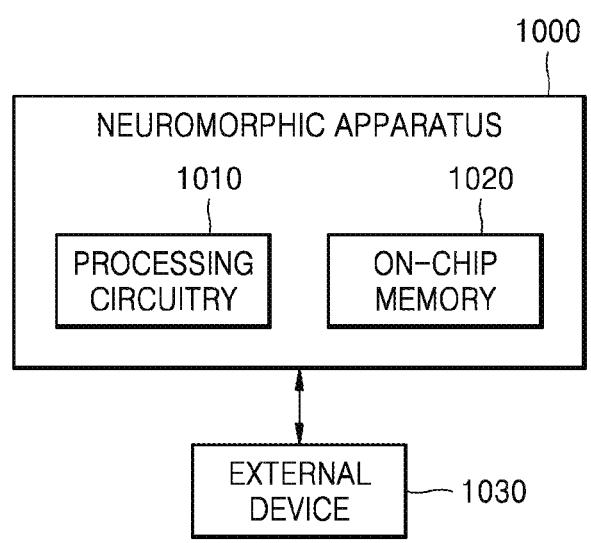
FIG. 27 is a schematic block diagram of a neuromorphic device including a memory device, according to an embodiment.

The memory block according to the embodiment described above may be realized in the form of a chip and may be used as a neuromorphic computing platform. For example, FIG. 27 is a schematic view of a neuromorphic device 1000 including a memory device, according to an embodiment. Referring to FIG. 27, the neuromorphic device 1000 may include a processing circuit 1010 and/or a memory 1020. The memory 1020 of the neuromorphic device 1000 may include the memory system 10 according to an embodiment.

In some example embodiments, processing circuitry 1010 may be configured to control functions for driving the neuromorphic apparatus 1000. For example, the processing circuitry 1010 may be configured to control the neuromorphic apparatus 1000 by executing programs stored in the memory 1020 of the neuromorphic apparatus 1000. In some example embodiments, the processing circuitry may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic apparatus 1700, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), or the like. In some example embodiments, the processing circuitry 1010 may be configured to read/write various data from/in the external device 1030 and/or execute the neuromorphic apparatus 1000 by using the read/written data. In some embodiments, the external device 1030 may include an external memory and/or sensor array with an image sensor (e.g., CMOS image sensor circuit).

Referring to FIGS. 1-2, the memory controller 100, write/read controller 110, voltage controller 120, and data determiner 130, voltage generator 220, control logic 250, and row decoder 230 also may be implemented with processing circuitry. The memory controller 100, in conjunction with the write/read controller 110, voltage controller 120, and data determiner 130 may operate based on control signals for controlling operations of the memory device 200 discussed herein, thereby transforming the memory controller 100—and write/read controller 110, voltage controller 120, and data determiner 130 therein—into special purpose processing circuitry.

In some embodiments, the neuromorphic apparatus in FIG. 27 may be applied in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A nonvolatile memory device comprising:
a plurality of memory cell strings,
each of the plurality of memory cell strings including a semiconductor layer, a plurality of gates and a plurality of insulators, a gate insulating layer, and a resistance change layer,
the semiconductor layer including a first semiconductor material and extending in a first direction, the semiconductor layer including a first surface and second surface opposite the first surface,
the plurality of gates and the plurality of insulators each extending in a second direction perpendicular to the first direction, the plurality of gates and the plurality of insulators being alternately arranged in the first direction,
the gate insulating layer extending in the first direction between the plurality of gates and the first surface of the semiconductor layer and between the plurality of insulators and the first surface of the semiconductor layer,
the resistance change layer extending in the first direction on the second surface of the semiconductor layer,
the resistance change layer including a metal-semiconductor oxide including a second semiconductor material and a transition metal oxide, and
the metal-semiconductor oxide having a charge trap site in a band gap of an oxide of the second semiconductor material.

2. The nonvolatile memory device of claim 1, wherein the metal-semiconductor oxide in the resistance change layer has an anti-site defect due to inversion of a site between the second semiconductor material and the transition metal oxide.

3. The nonvolatile memory device of claim 2, wherein a band gap of the transition metal oxide is less than the band gap of the oxide of the second semiconductor material.

4. The nonvolatile memory device of claim 3, wherein the band gap of the transition metal oxide is less than about 4.5 eV.

5. The nonvolatile memory device of claim 4, wherein the band gap of the transition metal oxide is less than about 3.5 eV.

6. The nonvolatile memory device of claim 1, wherein the first semiconductor material and the second semiconductor material are the same.

7. The nonvolatile memory device of claim 1, wherein
the first semiconductor material and the second semiconductor material are different from each other, and
the metal-semiconductor oxide of the resistance change layer includes both the first semiconductor material and the second semiconductor material.

8. The nonvolatile memory device of claim 1, wherein
the transition metal oxide includes at least one selected from among $Ta_2O_5$, BaO, and $TiO_2$, and
the metal-semiconductor oxide includes at least one of a Ta-silicate, a Ba-silicate, a Ti-silicate, $TaGe_xO_y$, $BaGe_xO_y$, and $TiGe_xO_y$.

9. The nonvolatile memory device of claim 1, wherein the first semiconductor material of the semiconductor layer includes at least one selected from among Si, Ge, indium gallium zinc oxide (IGZO), and GaAs.

10. The nonvolatile memory device of claim 1, wherein a ratio of the second semiconductor material in the resistance change layer is about 20 at. % to about 80 at. %.

11. The nonvolatile memory device of claim 10, wherein the ratio of the second semiconductor material in the resistance change layer is about 40 at. % to about 60 at. %.

12. The nonvolatile memory device of claim 10, wherein the ratio of the second semiconductor material in the resistance change layer is approximately constant throughout an entire area of the resistance change layer within a deviation range of about 10%.

13. The nonvolatile memory device of claim 1, wherein a thickness of the resistance change layer in the second direction is about 0.1 nm to about 2.0 nm.

14. The nonvolatile memory device of claim 13, wherein the thickness of the resistance change layer in the second direction is about 0.3 nm to about 1.5 nm.

15. The nonvolatile memory device of claim 14, wherein the thickness of the resistance change layer in the second direction is about 0.5 nm to about 1.0 nm.

16. The nonvolatile memory device of claim 13, wherein the thickness of the resistance change layer is approximately constant throughout an entire area of the resistance change layer extending in the first direction within a deviation range of about 10%.

17. The nonvolatile memory device of claim 1, wherein
one memory cell is defined by one gate among the plurality of gates, a portion of the gate insulating layer adjacent to the one gate in the second direction, a portion of the semiconductor layer adjacent to the one gate in the second direction, and a portion of the resistance change layer adjacent to the one gate in the second direction, and
a plurality of memory cells are arranged in each of the memory cell strings as a vertical stack structure.

18. The nonvolatile memory device of claim 17, further comprising:
a control logic configured to apply, in a program mode, a turn-on voltage to the gate of a non-selected memory cell from among the plurality of memory cell strings and a turn-off voltage to the gate of a selected memory cell from among the plurality of memory cell strings; and
a bit line configured to apply a program voltage to the selected memory cell.

19. The nonvolatile memory device of claim 18, wherein the resistance change layer is configured such that, in response to a positive program voltage being applied to the selected memory cell through the bit line, a resistance of a partial region of the resistance change layer corresponding to the selected memory cell decreases because an electron is trapped in a charge trap in the partial region of the resistance change layer, and
in response to a negative program voltage being applied to the selected memory cell through the bit line, the resistance of the partial region of the resistance change layer corresponding to the selected memory cell increases because the electron is de-trapped from the charge trap in the partial region of the resistance change layer.

20. The nonvolatile memory device of claim 19, wherein the positive program voltage is about 10 V or less.

21. The nonvolatile memory device of claim 20, wherein the positive program voltage is in a range between about 5 V and about 8 V.

22. The nonvolatile memory device of claim 19, wherein, in response to the resistance of the partial region of the resistance change layer decreasing, a direction of a current flowing through the partial region of the resistance change layer is the same as the first direction in which the resistance change layer extends.

23. The nonvolatile memory device of claim 19, wherein the partial region of the resistance change layer has at least three different resistance states.

24. The nonvolatile memory device of claim 23, wherein the nonvolatile memory device is configured to select the resistance states of the partial region of the resistance change layer based on adjusting a current applied to the partial region of the resistance change layer.

25. The nonvolatile memory device of claim 18, wherein the resistance change layer is configured such that, in response to a positive program voltage being applied to the selected memory cell through the bit line, oxygen vacancies move toward an interface between the semiconductor layer and the resistance change layer in a partial region of the resistance change layer corresponding to the selected memory cell, and
in response to a negative program voltage being applied to the selected memory cell through the bit line, the oxygen vacancies move away from the interface between the semiconductor layer and the resistance change layer in the partial region of the resistance change layer corresponding to the selected memory cell.

26. The nonvolatile memory device of claim 25, wherein the resistance change layer is configured such that, in response to the oxygen vacancies moving toward the interface between the semiconductor layer and the resistance change layer in the partial region of the resistance change layer so as to increase a density of the oxygen vacancies at the interface between the semiconductor layer and the resistance change layer, a resistance of the partial region of the resistance change layer decreases, and
in response to the oxygen vacancies moving away from the interface between the semiconductor layer and the resistance change layer in the partial region of the resistance change layer so as to decrease the density of the oxygen vacancies at the interface between the semiconductor layer and the resistance change layer, the resistance of the partial region of the resistance change layer increases.

27. The nonvolatile memory device of claim 26, wherein a resistance state of the resistance change layer is configured to change depending on a phenomenon in which an electron is trapped in a charge trap defined by the oxygen vacancies or de-trapped from the charge trap defined by the oxygen vacancies.

28. A nonvolatile memory device comprising:
a substrate;
a plurality of bit lines over the substrate, the plurality of bit lines extending in a first direction and being spaced apart from each other in a second direction crossing the first direction;
a plurality of gates and a plurality of insulators alternatively stacked on the substrate in a third direction vertical to a top surface of the substrate; and
a plurality of pillars spaced apart from each other on the substrate,
each corresponding pillar among the plurality of pillars being electrically connected to a corresponding bit line among the plurality of bit lines,
each of the plurality of pillars extending in the third direction through a corresponding hole defined in the plurality of gates and the plurality of insulators alternately stacked,
each of the plurality of pillars including a resistance change layer extending in the third direction, a semiconductor layer surrounding the resistance change layer, and a gate insulating layer surrounding the semiconductor layer,
the resistance change layer including a metal-semiconductor oxide having a resistance varying according to a voltage applied thereto, and
the resistance change layer including a charge trap site, wherein a thickness of the resistance change layer is about 0.1 nm to about 2.0 nm.

29. The nonvolatile memory device of claim 28, wherein in at least one of the plurality of the pillars,
the gate insulating layer directly contacts a first surface of the semiconductor layer,
the resistance change layer directly contacts a second surface of the semiconductor layer that is opposite the first surface of the semiconductor layer, and
the gate insulating layer extends between the plurality of gates and the semiconductor layer, the semiconductor layer includes a first semiconductor material, the metal-semiconductor oxide of the resistance change layer includes a second semiconductor material and a transition metal oxide, the first semiconductor material and the second semiconductor material are the same, the charge trap site of the resistance change layer is the metal-semiconductor oxide having a charge trap site in a band gap of an oxide of the second semiconductor material.

30. The nonvolatile memory device of claim 28, wherein the thickness of the resistance change layer is about 0.3 nm to about 1.5 nm.

31. The nonvolatile memory device of claim 28, wherein the metal-semiconductor oxide of the resistance change layer includes a semiconductor material and a transition metal oxide, the transition metal oxide includes at least one selected among $Ta_2O_5$, $BaO$, and $TiO_2$, and the metal-semiconductor oxide includes at least one of a Ta-silicate, a Ba-silicate, a Ti-silicate, $TaGe_xO_y$, $BaGe_xO_y$, and $TiGe_xO_y$.

32. The nonvolatile memory device of claim 28, wherein the metal-semiconductor oxide of the resistance change layer includes a semiconductor material and a transition metal oxide, and a ratio of the semiconductor material to the transition metal oxide in the resistance change layer is about 20 at. % to about 80 at. %.

* * * * *